(12) United States Patent
Asai et al.

(10) Patent No.: US 6,261,671 B1
(45) Date of Patent: Jul. 17, 2001

(54) ADHESIVE FOR ELECTROLESS PLATING, FEEDSTOCK COMPOSITION FOR PREPARING ADHESIVE FOR ELECTROLESS PLATING, AND PRINTED WIRING BOARD

(75) Inventors: Motoo Asai; Yoshitaka Ono; Masato Kawade; Kouta Noda; Youko Nishiwaki, all of Ibi-gun (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/402,475

(22) PCT Filed: Apr. 15, 1998

(86) PCT No.: PCT/JP98/01725

§ 371 Date: Oct. 12, 1999

§ 102(e) Date: Oct. 12, 1999

(87) PCT Pub. No.: WO98/47329

PCT Pub. Date: Oct. 22, 1998

(30) Foreign Application Priority Data

Apr. 15, 1997 (JP) .......................................... 9-97736
Jun. 12, 1997 (JP) .......................................... 9-155201
Dec. 5, 1997 (JP) .......................................... 9-335465
Dec. 5, 1997 (JP) .......................................... 9-335466

(51) Int. Cl.[7] .................................................... B32B 3/00
(52) U.S. Cl. ........................ 428/206; 428/209; 428/901; 174/259
(58) Field of Search ...................................... 428/209, 206, 428/901; 523/427; 174/259

(56) References Cited

U.S. PATENT DOCUMENTS

| | | | | |
|---|---|---|---|---|
| 4,752,499 | * | 6/1988 | Enomoto | 427/98 |
| 5,021,472 | * | 6/1991 | Enomoto | 523/427 |
| 5,055,321 | * | 10/1991 | Enomoto et al. | 427/98 |
| 5,447,996 | * | 9/1995 | Asai et al. | 428/901 |
| 5,589,255 | * | 12/1996 | Enomoto et al. | 428/356 |
| 5,688,583 | * | 11/1997 | Asai et al. | 428/206 |
| 5,741,575 | * | 4/1998 | Asai et al. | 428/901 |
| 6,010,768 | * | 1/2000 | Yasue et al. | 428/901 |

FOREIGN PATENT DOCUMENTS 0625537   11/1994   (EP) .

* cited by examiner

*Primary Examiner*—Cathy Lam
(74) *Attorney, Agent, or Firm*—Greenblum, Bernstein, P.L.C.

(57) ABSTRACT

The adhesive for electroless plating which is advantageous to ensure insulation reliabilities between lines and between layers while maintaining a practical peel strength, and the printed circuit board using the adhesive are disclosed. The adhesive is formed by dispersing cured heat-resistant resin particles soluble in acid or oxidizing agent into uncured heat-resistant resin matrix hardly soluble in acid or oxidizing agent through curing treatment, in which the heat-resistant resin particles have an average particle size of not more than 1.5 μm.

30 Claims, 13 Drawing Sheets

ADHESIVE FOR ELECTROLESS PLATING, FEEDSTOCK COMPOSITION FOR PREPARING ADHESIVE FOR ELECTROLESS PLATING, AND PRINTED WIRING BOARD

BACKGROUND OF THE INVENTION

1. Field of the Invention

This invention relates to an adhesive for electroless plating, material composites for preparing the adhesive for electroless plating and a printed circuit board, and more particularly to an adhesive for electroless plating suitable for the formation of fine pattern capable of ensuring an insulation reliability between lines while maintaining a practical peel strength in a semi-additive process or guaranteeing an insulation reliability between lines even at high temperature and high humidity conditions while maintaining a practical peel strength in a full-additive process, material composition for preparing the adhesive, and a printed circuit board using the adhesive.

2. Discussion of Background Information

Recently, so-called build-up multilayer circuit board is noticed from a demand for high densification of multilayer circuit boards. This build-up multilayer circuit board produced by a method as described, for example, in JP-B-4-55555. That is, an interlaminar resin insulating agent composed of a photosensitive adhesive for electroless plating is applied onto a core substrate, dried, exposed to a light and developed to form an interlaminar insulating resin layer having openings for viaholes, and then the surface of the interlaminar insulating resin layer is roughened by treating with an oxidizing agent or the like, and a plating resist is formed on the roughened surface by subjecting a photosensitive resin layer to light exposure and development treatments, and thereafter a non-forming portion of the plating resist is subjected to an electroless plating to form a conductor circuit pattern inclusive of viaholes, and next such steps are repeated plural times to obtain a multilayered build-up circuit board through an additive process.

In the build-up circuit board produced by such a method, the adhesive for electroless plating obtained by dispersing soluble cured resin particles consisting of rough particles having an average particle size of 2–10 μm and fine particles having an average particle size of not more than 2 m into a heat-resistant resin matrix hardly soluble through a curing treatment as disclosed in JP-A-63-158156 and JP-A-2-188992 (U.S. Pat. Nos. 5,500,321, and 5,519,177) is used in the interlaminar insulating resin layer.

Furthermore, JP-A-61-276875 (U.S. Pat. Nos. 4,752,499, and 5,021,472) discloses an adhesive for electroless plating obtained by dispersing soluble cured epoxy resin powder ground into an average particle size of 1.6 μm in a hardly soluble heat-resistant resin matrix.

The interlaminar insulating resin layer formed on the substrate using the above adhesive is roughened on its surface by dissolving and removing the heat-resistant resin particles existing in the surface area and is excellent in the adhesion property to a conductor circuit formed on the roughened surface through the plating resist.

However, the build-up circuit board retaining the plating resist as a permanent resist such as the circuit board produced by the full-additive process is bad in the adhesion property at the boundary between the permanent resist and the conductor circuit. Therefore, this build-up circuit board has a problem that when IC chip is mounted on the board, cracks are generated in the interlaminar insulating resin layer starting from a boundary between the plating resist and the conductor circuit resulted from a difference of thermal expansion coefficient.

On the contrary, a method of removing a plating resist and subjecting at least a side face of a conductor circuit to a roughening treatment to improve the adhesion property to an interlaminar insulating resin layer formed on the conductor circuit has hitherto been proposed as a technique capable of obstructing cracks created on the interlaminar insulating resin layer. As a method of producing a circuit board advantageously utilizing this method, mention may be made of the semi-additive process.

In the semi-additive process, the surface of the interlaminar insulating resin layer is first roughened and an electroless plated film is thinly formed over a full roughened surface and then a plating resist is formed on a non-conductor portion of the electroless plated film and further an electrolytic plated film is thickly formed on a no-resist forming portion and thereafter the plating resist and the electroless plated film located below the plating resist are removed to form a conductor circuit pattern.

However, the build-up circuit board produced through the semi-additive process using the above adhesive has a problem that the electroless plated film remains in a depression (anchor) of the roughened surface of the adhesive layer located under the resist to lower the insulation reliability between the lines.

And also, the build-up circuit board produced through the full-additive process using the above adhesive has a problem that the value of insulation resistance between the conductor circuits lowers under high temperature and high humidity conditions.

Moreover, the circuit boards produced through the full-additive process and semi-additive process have a problem that the interlaminar insulation is broken if the adhesive contains relatively large heat-resistant resin particles having an average particle size of not less than 2 μm.

The invention proposes a technique for solving problems inherent to the circuit board produced through the above full-additive process or semi-additive process. The present invention provides an adhesive for electroless plating which is advantageous to ensure insulation reliabilities between lines and between layers while maintaining a practical peel strength. The present invention also provides a printed circuit board having an excellent reliability by using the above adhesive for electroless plating.

On the other hand, the above-mentioned adhesive for electroless plating, in case the printed circuit boards are industrially massproduced, require to be preserved from the beginning of manufacturing up to the actual process of coating on the substrate.

For this reason, the adhesive for the electroless plating has drawbacks that a curing gradually proceeds or viscosity becomes high due to gelation during the preservation.

The present invention further provides an adhesive for the electroless plating which is capable of supressing the curing of the adhesive which is generated inevitably in the course of preservation, and to provide a method of manufacturing the printed circuit board using thus obtained adhesive for the electroless plating.

SUMMARY OF THE INVENTION

The inventor has made various studies in order to achieve the present invention and considered that the occurrence of the above problems results from the fact that the average particle size of the heat-resistant resin particles to be dissolved and removed is too large and found the following knowledge.

That is, the interlaminar insulating resin layer consisting of the above adhesive obtained by dispersing soluble resin particles comprised of rough particles having an average particle size of 2–10 $\mu$m and fine particles having an average particle size of not more than 2 $\mu$m is that a depth of a depression in a roughened surface formed on the surface of this layer is about 10 $\mu$m (e.g. Example 1 of JP-A-7-34048 (U.S. Pat. No. 5,519,177)). Therefore, it is considered that since the electroless plated film is formed in the depth portion of the depression through the semi-additive process, it can not be removed completely and is retained to degrade the insulating property between lines. On the other hand, in the full-additive process, the surface area becomes large as the depression in the roughened surface becomes deep, and a great number of palladium being a catalyst nucleus of the electroless plated film beneath the plating resist between lines. As a result, it is considered that the palladium reacts with chlorine ion or the like in the heat-resistant resin under conditions of high temperature and high humidity to form a conductive compound to thereby lower the insulating property between lines.

When the heat-resistant resin particles having an average particle size of not less than 2 $\mu$m are existent in the interlaminar insulating resin layer, gaps are apt to be created by the roughening treatment, so that it is considered that the plated film is precipitated into the gaps to electrically connect the upper layer conductor circuit to the lower layer conductor circuit to thereby break the interlaminar insulation.

Based on the above knowledge, the inventor developed the adhesive for electroless plating having the following features.

(1) The adhesive for electroless plating according to the present invention is an adhesive for electroless plating formed by dispersing cured heat-resistant resin particles soluble in acid or oxidizing agent into uncured heat-resistant resin matrix hardly soluble in acid or oxidizing agent through curing treatment, characterized in that the heat-resistant resin particles have an average particle size of not more than 1.5 $\mu$m, preferably 0.1–1.0 $\mu$m.

It is preferred that the heat-resistant resin particles are spherical particles and have a particle size distribution that a particle size of a peak in the distribution is not more than 1.5 $\mu$m and the peak of this distribution is one.

Further, the printed circuit board according to the present invention is characterized by having the following construction.

(2) In a printed circuit board comprising a substrate, a cured adhesive layer for electroless plating having a roughened surface, and a conductor circuit formed on the roughened surface of the adhesive layer, said circuit is characterized by the adhesive layer for electroless plating formed by dispersing cured heat-resistant resin particles soluble in acid or oxidizing agent into uncured heat-resistant resin matrix hardly soluble in acid or oxidizing agent through curing treatment, and characterized by the heat-resistant resin particles having an average particle size of not more than 1.5 $\mu$m, preferably 0.1–1.0 $\mu$m.

It is preferred that the heat-resistant particles are spherical particles and have a particle size distribution that a particle size of a peak in the distribution is not more than 1.5 $\mu$m and the peak of this distribution is one.

The roughened surface of the adhesive layer is favorable to have a depression depth Rmax=1–5 $\mu$m.

Further, the printed circuit board (multilayered printed wiring board) according to the present invention is characterized by having the following construction.

(3) In the printed circuit board comprising a substrate having formed thereon a conductor circuit, a cured adhesive layer for electroless plating formed on the substrate by dispersing cured heat-resistant resin particles soluble in acid or oxidizing agent into uncured heat-resistant resin matrix hardly soluble in acid or oxidizing agent through curing treatment, a roughened surface formed on the adhesive layer in such a manner that the heat-resistant resin particles are dissolving and removed, and an upper conductor circuit formed on the roughened surface, said printed circuit board is characterized in that the adhesive layer for electroless plating contains more heat-resistant particles at the side of the substrate than that at the opposite side thereof.

Here, it is desirable that the adhesive layer is formed in double-layer, the heat-resistant particles in the adhesive layer at the side of the substrate is 20–50% by weight of to a solid content of the heat-resistant resin matrix, while the heat-resistant particles in the adhesive layer at the opposite side of the substrate is not less than 5% by weight but less than 20% by weight of to a solid content of the heat-resistant resin matrix.

Furthermore, material composition for preparing the adhesive for the electroless plating, according to the present invention, which is capable of suppressing the curing of the adhesive which inevitably occurs in the course of preservation, is comprised of resin composition groups 1–3, each of the group prepared in advance for mixture, and kept or preserved in a separated manner to one another;

group 1: a resin composition comprising an uncured thermosetting resin which becomes hardly soluble in the acid or oxidizing agent through curing treatment, group 2: a resin composition comprising a cured heat-resistant resin particles soluble in an acid or oxidizing agent and having an average paticle size of not more than 1.5 $\mu$m, a thermoplastic resin, and an organic solvent, and group 3: a curing agent composition.

Here, it is desirable that the heat-resistant resin particles of the group 2 is 5–50% by weight of a solid of the heat-resistant resin matrix in the prepared adhesive agent.

Further, it is desirable that the weight ratio between the thermosetting resin of the group 1 and the thermoplastic resin of the group 2 is ¼~4/1.

BRIEF DESCRIPTION OF THE DRAWINGS

The invention will be described with reference to the accompanying drawings, wherein.

Figure 1:
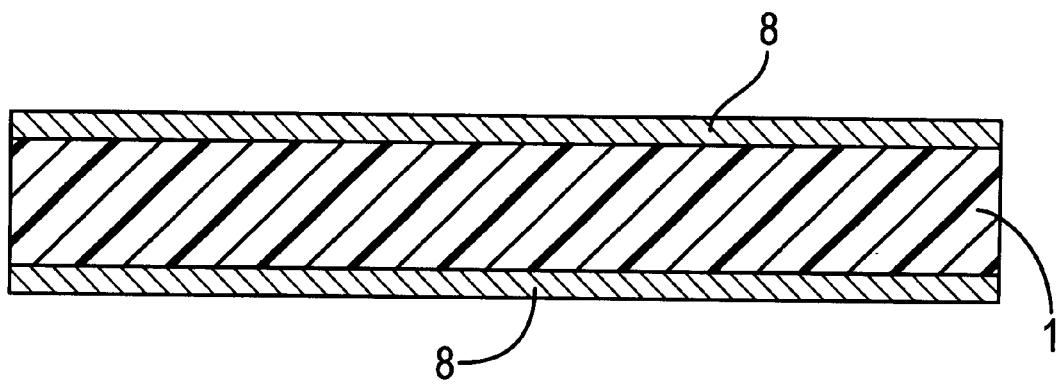
FIGS. 1–20 are diagrammatic views illustrating procsses in the production of the multilayer printed circuit board through semi-additive process using the adhesive for electroless plating according to the present invention.

In the drawings, the reference numeral 1 indicates a substrate, 2 an interlaminar resin insulating layer (adhesive layer for electroless palting), 3 a permanent resist (plating resist), 4 an inner conductor circuit (inner layer pattern), 5 an inner conductor circuit (second layer pattern), 6 an opening for viahole, 7 a viahole, 8 a copper foil, 9 a through hole, 10 a resin filler, 11 a roughened layer, 12 an electroless plated film, 13 an electrolytic plated film, 14 a solder resist layer, 15 a nickel plating layer, 16 a gold plating layer, and 17 a solder body (solder bump).

DETAILED DESCRIPTION OF THE INVENTION

In the semi-additive process, it is necessary to dissolve and remove the electroless plated film beneath the plating resist as previously mentioned. Therefore, if the depression of the roughened surface is deep, the electroless plated film is apt to be left in the depression, which results in the lowering of the insulation resistance value between lines. On the other hand, if the depression has a simple shape and is shallow, the peel strength of the plated film lowers and the conductor is apt to be peeled off.

In case of the full-additive process, the palladium catalyst remains beneath the plating resist as previously mentioned, so that if the depression of the roughened surface is deep, the insulation resistance value between lines lowers under conditions of high temperature and high humidity. On the other hand, if the depression has a simple shape and is shallow, the peel strength of the plated film lowers and the conductor is apt to be peeled off likewise the case of the semi-additive process.

In this connection, the adhesive for electroless plating according to the present invention is characterized by including the heat-resistant resin particles having an average particle size of not more than 1.5 $\mu$m, preferably the heat-resistant resin particles having a particle size distribution such that the particles do not have a particle size in a peak of this distribution while more than 1.5 $\mu$m. As a result, the depression of the roughened surface is not deep due to the dissolution of the resin particles having a large particle size (i.e. the depression of the roughened surface is made shallow) and hence the dissolved residue of the electroless plated film in the depression is removed or the amount of the palladium catalyst beneath the plating resist is decreased, so that the insulation reliability between lines and between layers can be ensured while maintaining the practical peel strength even if the roughened surface has shallow depressions.

In the adhesive for electroless plating according to the present invention, the heat-resistant resin particles are not more than 1.5 $\mu$m in the average particle size, and preferably have a particle size distribution such that the particles do not have a particle size in a peak of this distribution which is more than 1.5 $\mu$m, so that the depth of the depression formed by removal and dissolution is shallow without the resin particles having a large particle size as in the conventional technique and there is caused no gap even when the roughening too proceeds. Therefore, the printed circuit board produced by using the adhesive containing such heat-resistant resin particles is excellent in the insulating property between layers.

In the printed circuit board produced by using the adhesive containing the heat-resistant resin particles, the practical peel strength can be maintained even if the depression of the roughened surface is shallow.

For example, in case of the full-additive process, the photosensitive resin layer for the formation of the plating resist formed on the roughened surface is subjected to light exposure and development to form the plating resist. Therefore, if the depression of the roughened surface is deep, the developed residue of the plating resist is liable to be retained in the depression. In the invention, however, the depression to be formed is shallow and the resist in the depression can easily be developed, so that there is hardly created the developed residue of the plating resist, and even if the depression is made shallow, the lowering of the peel strength is relatively small.

On the other hand, in case of the semi-additive process, there is a method of directly forming the electroless plated film on the roughened surface, so that the plating resist does not remain in the depression of the roughened surface, and even if the depression is made shallow, the lowering of the peel strength is relatively small.

Moreover, when the opening for the formation of the viahole is formed by light exposure and development, laser processing or the like, the adhesive for electroless plating remains as a residue in the bottom of the opening for the formation of the viahole. In the invention, the fine heat-resistant resin particles soluble in acid or oxidizing agent having an average particle size of not more than 1.5 $\mu$m (preferably 0.1–1.0 $\mu$m) are existent in the adhesive for electroless plating, so that the above residue can easily be removed by the roughening treatment with acid or oxidizing agent and hence it is not necessary to form a layer for the removal of the residue beneath the adhesive layer.

In the present invention, the resulting depression is shallow, so that even when adopting either semi-additive process or full additive process, there can be formed a fine pattern having a ratio of line/space (hereinafter referred to as L/S simply)=less than 40/40 $\mu$m.

The heat-resistant resin particles according to the present invention are preferable to be spherical particles instead of ground particles. Because when the heat-resistant resin particles are ground particles, the depression shape in the roughened surface is sharp and stress concentration is apt to be caused in the sharped corner and cracks are liable to be created from the corner through heat cycle.

The heat-resistant resin particles are preferred to have an average particle size of 0.1–1.0 $\mu$m. When the average particle size is within the above range, the depth of the depression formed by dissolving and removing the heat-resistant resin particles is approximately Rmax=about 3 $\mu$m.

As a result, in the semi-additive process, the electroless plated film on the non-conductor portion can easily be removed by etching and also the Pd catalyst nucleus existing beneath the electroless plated film can easily be removed, while the peel strength of the conductor portion can be maintained at a practical level of 1.0–1.3 kg/cm. On the other hand, in the full-additive process, the amount of Pd catalyst nucleus beneath the plating resist can be decreased and also the plating resist residue on the conductor portion can be removed, so that even if the depression is shallow, the peel strength can be maintained at a practical level of 1.0–1.3 kg/cm.

The heat-resistant resin particles are desirable to have such a particle size distribution that a peak of this distribution is not more than 1.5 $\mu$m, preferably 0.1–1.0 $\mu$m. Particularly, when the peak of the particle size distribution is existent in a region of 0.1–1.0 $\mu$m, it is desirable that a standard deviation is not more than 0.5. By the adjustment of the particle size distribution, the particles constituting the heat-resistant resin particles are less than 2 µm, whereby the influence of the resin particles having a large particle size as in the conventional technique can completely be eliminated.

In this case, the particle size distribution of the heat-resistant resin particles is measured by laser diffraction/scattering process. A measuring theory of the laser diffraction/scattering process will be described below.

At first, a laser beam is irradiated to the particles to be measured to spacely create a pattern of light intensity distribution of the diffraction/scattering light. The light intensity distribution pattern changes in accordance with the size of the particles. That is, the particle size and the light intensity distribution pattern are existent as a relation of 1:1, so that the particle size can be specified by providing the light intensity distribution pattern.

The actual sample is particle groups comprised of many particles. Therefore, light intensity distribution pattern is a piling of diffraction/scattering lights of respective particles. Therefore, the particle size distribution of the sample particle groups is calculated from the piled light intensity distribution patterns.

Moreover, there are Shimazu laser diffraction type particle size distribution measuring device SALD-2000/SALD-2000A and Shimazu laser diffraction type particle size distribution measuring device SALD-3000 made by Shimazu Seisakusho as a measuring device utilizing such a laser diffraction/scattering process.

Figure 25:
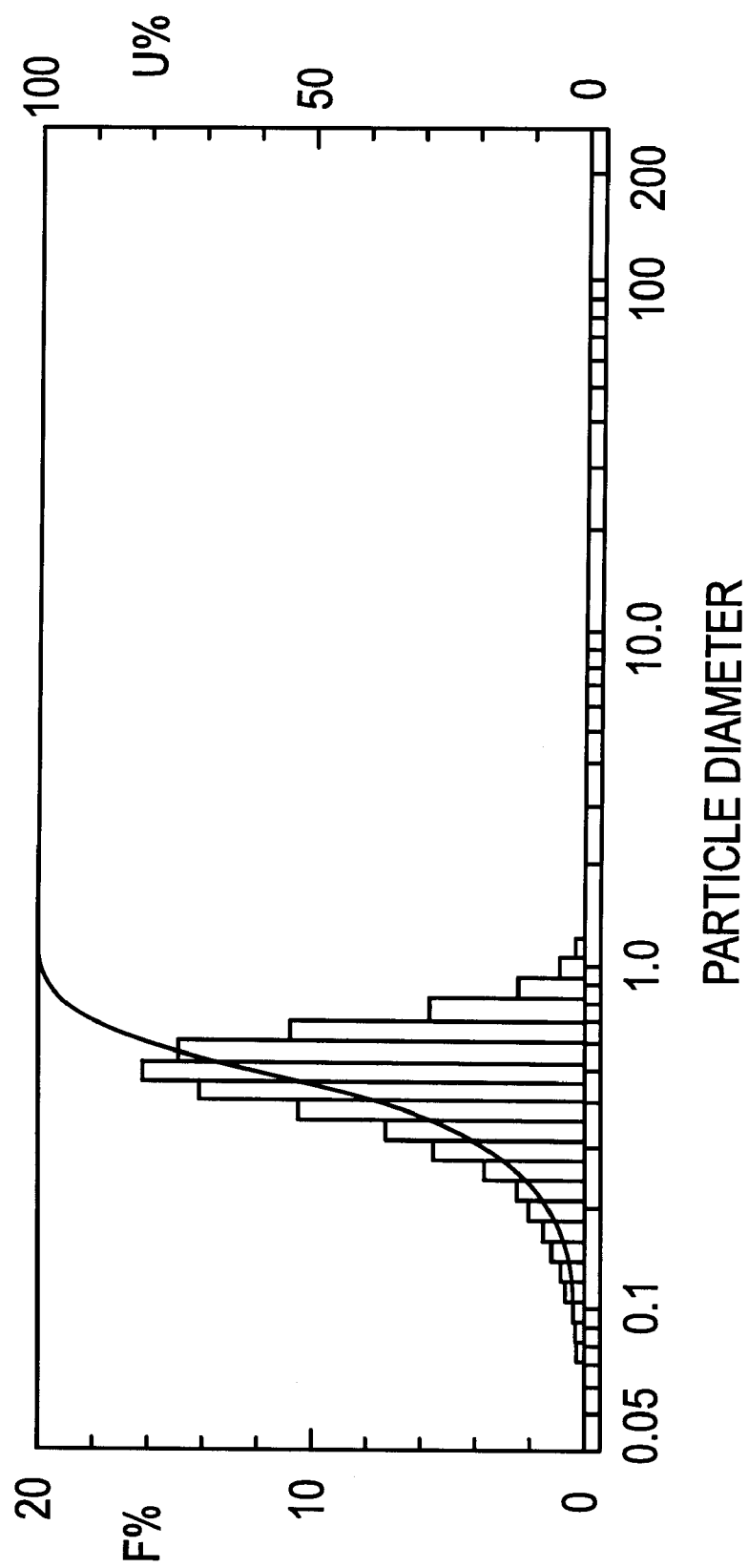
FIG. 25 is a graph of a particle size distribution showing one embodiment of a relation between particle size of heat-resistant resin particle and an existing ratio (existing amount) of heat-resistant resin particles at this particle size.
Figure 26:
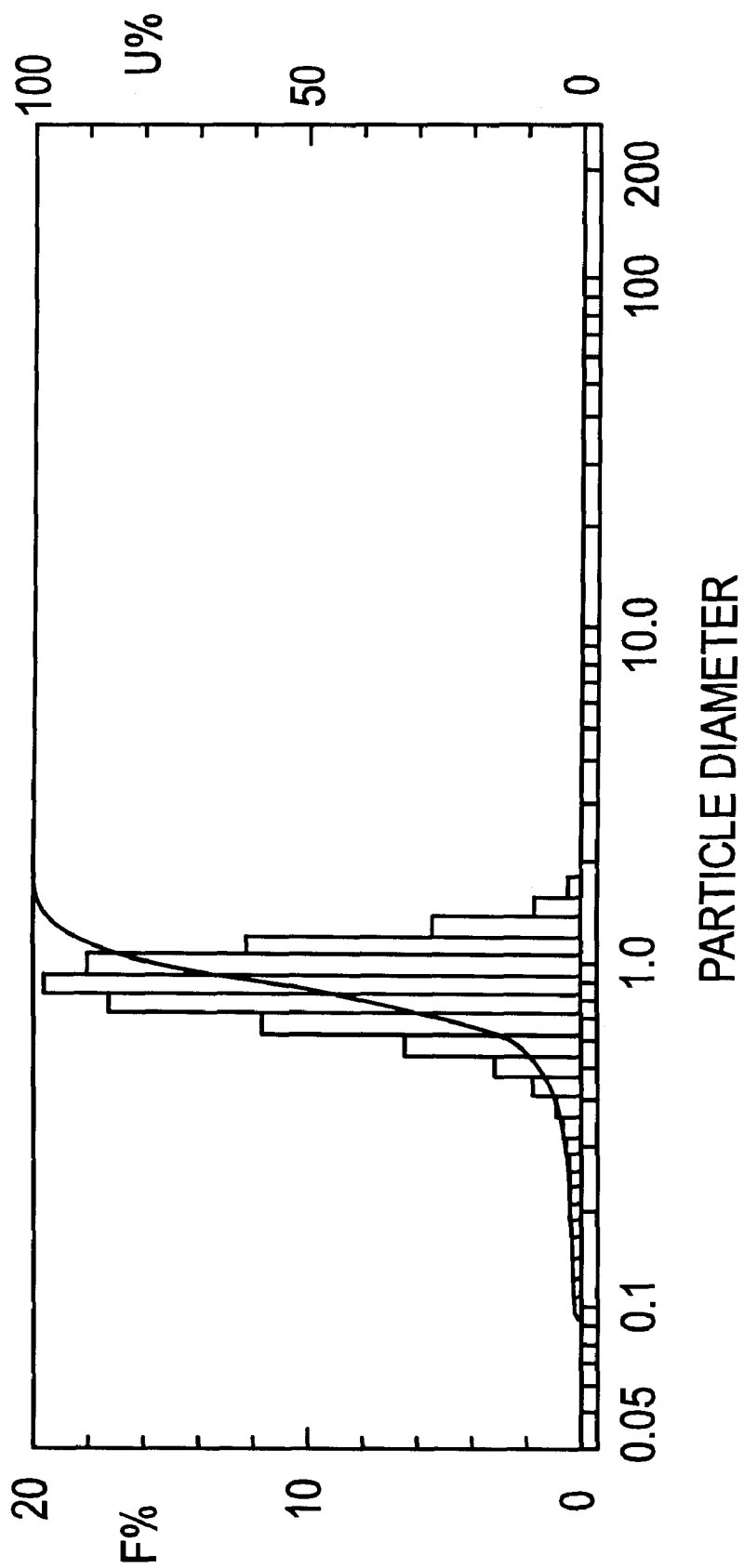
FIG. 26 is a graph of a particle size distribution showing another embodiment of a relation between particle size of heat-resistant resin particle and an existing ratio (existing amount) of heat-resistant resin particles at this particle size.

As the thus obtained particle size distribution, there is a relation between the particle size and an existing ratio (existing quantity) of the resin particles indicating such a particle size as shown, for example, in FIGS. 25 and 26. The term peak of particle size distribution used herein means a maximum point of the existing ratio of the resin particles.

In the present invention, the heat-resistant resin particles are favorable to have one peak of the particle size distribution. That is, the maxim value of the existing ratio (existing quantity) of the resin particles is one.

By such a particle size distribution, the light scattering resulted from the distribution of the particle size can be controlled and hence the developed residue becomes less. Further, the maintenance of the product is easy and the scattering of the properties such as peel strength and the like hardly occurs and the printed circuit board can be provided in an excellent mass production.

Moreover, the adjustment of particle size distribution is carried out by centrifugal separation, air classification, sieving or the like.

In the adhesive for electroless plating according to the present invention, the mixing ratio of the heat-resistant resin particles is 5–50% by weight, preferably 10–40% by weight to a solid content in the heat-resistant resin matrix as a weight ratio. The reason is that when the resin particles are contained too much, the breakage of interlaminar insulation is apt to be caused due to the progress of the roughening and hence a clear roughened surface can not be formed, while when the resin particles are contained less, the clear roughened surface can not be formed.

In the adhesive for electroless plating according to the present invention, it is necessary that the heat-resistant resin particles are previously subjected to a curing treatment. If the particles are not cured, they are dissolved in a solvent dissolving the resin matrix and uniformly mixed with the matrix and hence only the heat-resistant resin particles can not selectively be dissolved and removed with acid or oxidizing agent.

In the adhesive for electroless plating according to the present invention, thermosetting resins (including a case of photosensitizing a part or whole of thermosetting group) and a composite of thermosetting resin (including a case of photosensitizing a part or whole of thermosetting group) and thermoplastic resin can be used as the heat-resistant resin matrix.

As the thermosetting resin, use may be made of epoxy resin, phenolic resin, polyimide resin and the like. As the epoxy resin, use may be made of novolac-type epoxy resin, alicyclic epoxy resin and the like.

It is desirable that in the thermosetting resin a part of the thermosetting functional group is replaced with photosensitive group to impart photosensitivity. This is because if the interlaminar insulating layer is formed by using such adhesive agent that contains as a resin component the thermosetting resin with photosensitivity, the openings for the viaholes may easily be formed in the adhesive layer by the light exposure and development treatment.

Moreover, if a part or whole of the thermosetting group is photosensitized, it is acrylated by reacting with methacrylic acid, acrylic acid or the like. Particularly, an acrylated epoxy resin is optimum.

As the thermoplastic resin, use may be made of polyether sulphone, polysulphone, polyphenylene sulphone, polyphenylene sulfide, polyphenyl ether, polyether imide and the like.

The thermoplastic resin is preferred to be less than 30% by weight of a solid content in the resin matrix, more preferably 10–25% by weight of the solid content in the resin matrix. If it is not less than 30% by weight of the solid content in the resin matrix, the thermoplastic resin remains at the bottom of the opening for the formation of the viahole, resulting in the peeling off between the viaholes and inner conductor circuits due to bad continuity and heating test.

The heat-resistant resin matrix is preferred to be a composite of the epoxy resin and PES, and PES in the composite is less than 30% by weight of a solid content of the heat-resistant resin matrix.

In the adhesive for electroless plating according to the present invention, amino resin (such as melamine resin, urea resin, guanamine resin or the like), epoxy resin, bismaleimide-triazine resin and the like can be used as a material for the heat-resistant resin particles.

In the adhesive for electroless plating according to the present invention, amino resin (such as melamine resin, urea resin, guanamine resin or the like), epoxy resin, bismaleimide -triazine resin and the like can be used as a material for the heat-resistant resin particles.

Moreover, the epoxy resins can optionally be prepared to ones soluble in acid or oxidizing agent and ones hardly soluble therein by properly selecting kind of oligomer, kind of curing agent and the like. For example, resin obtained by curing bisphenol A-type epoxy oligomer with an amine curing agent is easily soluble in chromic acid, while resin obtained by curing cresol novolac type epoxy oligomer with an imidazole curing agent is hardly soluble in chromic acid.

Moreover, the adhesive for electroless plating according to the present invention may be rendered into B-stage by impregnating in a fibrous substrate such as glass cloth or the like, or may be shaped into a film. Further, it may be shaped into a substrate. Moreover, the adhesive for electroless plating according to the present invention may be flameretarded by halogenating the constitutional resin, or may be added with coloring matter, pigment and ultraviolet ray absorbing agent. And also, the toughness and thermal expansion coefficient may be adjusted by filling fibrous filler or inorganic filler.

Then, the printed circuit board using the adhesive for electroless plating according to the present invention is a printed circuit board comprising a substrate, a cured adhesive layer for electroless plating having a roughened surface, and a conductor circuit formed on the roughened surface of the adhesive layer, this adhesive layer is composed of an adhesive for electroless plating formed by dispersing cured heat-resistant resin particles soluble in acid or oxidizing agent into uncured heat-resistant resin matrix hardly soluble in acid or oxidizing agent through curing treatment, characterized in that the heat-resistant resin particles have an average particle size of not more than 1.5 $\mu$m, preferably 0.1–1.0 $\mu$m.

In the printed circuit board according to the present invention, the heat-resistant resin particles are not more than 1.5 $\mu$m in the average particle size, and preferably have a particle size distribution such that the particles do not have a particle size in a peak of the distribution which is more than 1.5 $\mu$m, so that the depth of the depression formed by removal and dissolution is shallow without the resin particles having a large particle size as in the conventional technique and there is caused no gap even when the roughening too proceeds. Therefore, the printed circuit board according to the present invention having the adhesive containing such heat-resistant resin particles is excellent in the insulating property between layers. Further, the printed circuit board according to the present invention maintain the practical peel strength even when the depression of the roughened surface is shallow.

In the printed circuit board according to the present invention, the heat-resistant resin particles are preferred to have one peak of the particle size distribution. That is, the maximum value of the existing ratio (existing quantity) of the resin particles is one. By such a particle size distribution, the light scattering resulted from the distribution of the particle size can be controlled and hence the developed residue becomes less. As a result, the wall face shape in the opening portion for viahole is good.

In the printed circuit board according to the present invention, the roughened surface of the adhesive layer is preferred to have a depression depth of Rmax=1–5 $\mu$m. This depression depth is about half of a depression depth Rmax=10 $\mu$m in the roughened surface formed by the conventional adhesive, which is a range of not leaving the plated film even if the electroless plated film is dissolved and removed beneath the plating resist and capable of decreasing the amount of the palladium catalyst nucleus beneath the playing resist.

Furthermore, it is preferable that the roughened surface has depression depth of 1–5 $\mu$m and the count value of the peak (Pc) of the roughness per a 2.5 mm length of the surface, where 0.01≦Pc≦0.1 $\mu$m is 10–2500, the count value where 0.1≦Pc≦1.0 $\mu$m is 100–1000, respectively. With such decreased number of minute depressions, the plating resist is prevented from remaining on the roughened surface in the full-additive process, and the electroless plating film and Pd catalyst are prevented from remaining on the roughened surface. It has been found that the peel strength is not reduced with the decreased number of the minute depressions.

The number of the minute depressions are counted or measured by means of the atomic force microscope (AFM by Olympus Optical Co.,Ltd.) in the AC mode operation (resonance) after 10 minutes Blower-type static electricity removal operation.

The Japanese unexamined patent publication No.10-4262 discloses such roughened surface with which conductor circuitry is in contact. With respect to such roughened surface, the count value of the peak (Pc) of the roughness per a 2.5 mm length of the surface, where 0.01≦Pc≦0.1 $\mu$m is 12000 or greater, and the count value of the peak (Pc) where 0.1≦Pc≦1.0 $\mu$m is 25000 or greater, respectively, however, the number of the minute depression is excessive, and the plating resist, electroles plating film and Pd catalyst remains in the roughened surface, resulting in the peel strength not improved.

In the printed circuit board according to the present invention comprising a substrate having formed thereon a conductor circuit, a cured adhesive layer for electroless plating formed on the substrate by dispersing cured heat-resistant resin particles soluble in acid or oxidizing agent into uncured heat-resistant resin matrix hardly soluble in acid or oxidizing agent through curing treatment, a roughened surface formed on the adhesive layer in such a manner that the heat-resistant resin particles are dissolving and removed, and an upper conductor circuit formed on the roughened surface, the printed circuit board is characterized in that the adhesive layer for electroless plating contains more heat-resistant particles at the side of the substrate than that at the opposite side thereof.

According to such structure of the interlaminar insulating resin layer, it is possible to realize shallow roughened surfaces with high roughing ability, providing a multilayered printed circuit board having fine patterns and minute viaholes.

In concrete, it is desirable that the adhesive layer is formed in double-layer (underlayer and upperlayer), the heat-resistant particles in the adhesive layer at the side of the substrate (upperlayer) is 20–50% by weight of a solid content of the heat-resistant resin matrix, while the heat-resistant particles in the adhesive layer at the opposite side of the substrate (upper layer) is not less than 5% by weight but less than 20% by weight of a solid content of the heat-resistant resin matrix.

The compounding quantity of the heat-resistant resin particles contained in the underlayer of the adhesive layer is selected to be within such a range that the resin residue may be removed in the roughening treatment and the inner wall of the bottom of the viahole does not become so large, while the compounding quantity of the heat-reistant resin particles contained in the upperlayer of the adhesive layer is selected to be within such a range that the anchoring of the roughened surface may be shallow enough to obtain an adequate peel strength.

In this invention, the adhesive layer is desirable to have a thickness of less than 50 $\mu$m, preferably 15–45 $\mu$m. If the thickness is less than 50 $\mu$m, the heat-resistant resin particles in the adhesive layer are apt to be associated to one another, causing breakage of the interlaminar insulating. In this connection, according to the present invention, such breakage is not easily occurred due to the minute diameter of the heat-resistant resin particles.

Further, it is desirable that viaholes each having a diameter of less than 100 $\mu$m are formed on the adhesive layer for the electroless plating. In the case of forming viaholes having smaller diameter, developed residue of the plating resist is liable to be retained. In this connection, the developed residue can easily be removed since the adhesive agent containing the minute heat-resistant resin particles is used in the present invention. Further, in the case of forming viaholes with smaller diameter, when the adhesive agent contains larger-size particles, the viahole diameter becomes large in the roughening treatment. In this connection, it is advantageous to use such adhesive agent containing minute heat-resistant resin particles.

In the printed circuit board according to the present invention, the conductor circuit formed on the roughened surface of the adhesive layer is preferable to be comprised of thin electroless plated film and thick electrolytic plated film in the semi-additive process. Since the electrolytic plated film showing a small plating stress is thickened, even if the depression of the roughened surface is shallow, there is caused no peeling of the plated film.

In the printed circuit board according to the present invention, the conductor circuit may be formed on the surface of the substrate forming the adhesive for electroless plating thereon. In this case, the conductor circuit is preferred to have a roughened layer on at least a part of the surface thereof. For example, it is desirable that when the substrata is formed through the full-additive process, the roughening layer is formed on an upper surface of the conductor circuit, or when the substrate is formed through the semi-additive process, the roughened layer is formed on a aide surface or full surface of the conductor circuit. Because the adhesion property to the adhesive layer for electroless plating is improved by these roughening layers and hence the occurrence of cracks resulted from the difference of thermal expansion coefficient between the conductor circuit and the adhesive for electroless plating in the heat cycle can be controlled.

Further, it is preferred that the roughened layer is formed on at least a part of the surface of the conductor circuit formed on the roughened surface of the adhesive layer, i.e. an upper surface, side surface or full surface thereof. Because, the adhesion property to a solder resist covering the conductor circuit or an upper interlaminar insulating resin layer can be improved to control the occurrence of cracks in the heat cycle.

The formation of such roughened surface is apt to cause the resin remained in the roughened layer when the opening for the formation of viaholes are formed in the upper interlaminar insulating resin layer. In this connection, according to the adhesive for electroless plating comprising fine particles having an average particle size of not more than 2 $\mu$m as heat-resistant resin particles soluble in an acid or oxidizing agent, the resin residue can easily be dissolved and removed by the acid or oxidation treatment, since such fine particles are present in the resin residue in the roughened surface.

The roughness of the roughened surface is preferred to be 0.1 $\mu$m~10 $\mu$m, because this range of roughness provides best adhesion property.

It is desirable that the roughness of the roughened surface is 0.1~10 $\mu$m and the count value of the peak (Pc) of the roughness at a surface length of 2.5 mm where $0.01 \leq Pc \leq 0.1$ $\mu$m is 100~1000, the count value where $0.1 \leq Pc \leq 1.0$ $\mu$m is 100~2000, respectively. With such comparatively decreased number of minute depressions, the resin residue in the roughened surface appearing when the openings for the formation of viaoles are formed can be reduced. Further, with such decreased number of minute depressions that do not improve the peel strength, the high frequency signal is prevented from being delayed in propagation along the conductor circuit, since the high frequency signal travels on a surface of the conductor layer.

The Japanese unexamined patent publication No. 10-4261 discloses such roughened surface with which conductor circuitry is in contact that the count value of the peak (Pc) of the roughness per a 2.5 mm length of the surface, where $0.01 \leq Pc \leq 0.1$ $\mu$m is 30000 or greater, and the count value of the peak (Pc) where $0.1 \leq Pc \leq 1.0$ $\mu$m is 3000–10000, respectively, however, the number of the minute depression is excessive, and the resin residue can remarkably be seen.

The number of the minute depressions was counted or measured by means of the atomic force microscope (AFM by Olympus Optical Co., Ltd.) in the AC mode operation (resonance) after 10 minutes Blower-type static electricity removal operation.

Next, the material composition for preparing the above-mentioned adhesive for electroless plating will be explained.

The material composition is comprised of resin composition groups 1–3, each group prepared in advance for mixture, and kept or preserved in a separated manner to one another;

group 1: a resin composition comprising an uncured thermosetting resin which becomes hardly soluble in the acid or oxidizing agent through curing treatment, group 2: a resin composition comprising a cured heat-resistant resin particles soluble in an acid or oxidizing agent and having an average particle size of not more than 1.5 $\mu$m, a thermoplastic resin, and an organic solvent, and group 3: a curing agent composition.

With each resin composition of each group being kept or preserved in a separated manner to one another, the curing of the resin component of each composition does not proceed, and there can be seen no viscosity increasing. If the resin compositions of group 1 and 2 are mixed together and left as it is for a long time, the mixture is get gelation and the viscosity increases despite of the absence of the curing agent. In this connection, such gelation does not occur because the composition of each group is preserved in a separated manner to one another.

Further, according to the present invention, the photopolymerization reaction of the resin component does not proceed even in the case of the resin component exposed to light. As a result, no degradation can be seen in the resolving degree when the adhesive for electroless plating comprising such material composition is applied on the substrate and exposed to light in the manufacturing process of the printed circuit board.

In the material composition of the present invention, it is desirable that a mixing ratio of the heat-resistant resin particles is 5–50% by weight of a solid content of the heat-resistant resin matrix in the prepared adhesive agent, as a weight ratio.

Furthermore, a mixing ratio of the thermosetting resin in the group 1 to the thermoplastic resin in the group 2 is preferable to be ¼~⁹⁄₁ as a weight ratio. This is because such a range of the mixing ratio can provide an improved toughness of the thermosetting resin.

The organic solvent in the group 2 is preferable to be 100–300 parts by weight of the 100 parts of the thermoplastic resin.

The curing agent in the group 3 is preferable to be 1–10% by weight of a total solid content of the adhesive for electroless plating matrix.

As the curing agent, it is desirable to use such a type of curing agent that is liquid at the temperature of 25° C., i.e. liquid imidazole curing agent such as 1-benzyl-2-ethylimidazole(1B2MZ), 1-cyanoethyl-2-4- methylimidazole (2E4MZ-CN), or 4-methyl-2-ethylimidazole (2E4MZ).

As the organic solvent, it is desirable to use glycolic ether type solvent such as diethylene glycol dimethyl ether (DMDG), and triethylene glycol dimethyl ether (DMTG), having the below structural formulator normal methyl pyroridone (NMP).

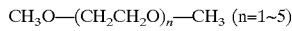

$CH_3O—(CH_2CH_2O)_n—CH_3$ (n=1~5)

A photosensitive monomer and/or deforming agent may be added to the composition of the group 1. As the photosensitive monomer, Aronix M325, M315 (by Toa Gosei Co., Ltd.), DPE-6A (by Nippon Kayaku Co., Ltd.), or R-604(by Kyoeisha Kagaku Co., Ltd) may be used. As the deforming agent, silicon type deforming agent or S-65 (by Sannopco Co., Ltd.) may be used.

It is desirable that the composition of the group 3 contains a curing agent of the thermosetting resin and photoinitiator, ensuring the carrying out of exposure and development treatment of the adhesive and curing of the adhesive by heating treatment. Further, photoinitiator and photosensitizer may be added to the composition of the group 3.

As the photoinitiator, Irgaquar 907 made by Ciba Geigy or benzophenone may be used, and as the photosensitizer, DETX-S made by Nippon kayaku Co., Ltd. or Michelars' ketone may be used.

A method of producing the printed circuit board according to the present invention through semi-additive or full-additive process will concretely be described below.

[Semi-Additive Process]

(1) In order to produce a multilayer circuit board through the semi-additive process, a circuit substrate is first prepared by forming a conductor circuit on a surface of a substrate.

As the substrate, use may be made of insulating resin substrates such as glass epoxy substrate, polyimide substrate, bismaleimide-triazine substrate and the like, ceramic substrate, metal substrate and so on.

The conductor circuit in the wiring substrate is formed by a method of etching a copper-clad laminate, or a method of forming an adhesive layer for electroless plating on a substrate such as glass epoxy substrate, polyimide substrate, ceramic substrate, metal substrate or the like and roughening the surface of the adhesive layer and subjecting the roughened surface to an electroless plating, or so-called semi-additive process (the whole of the roughened surface is subjected to a thin electroless plating to form a plating resist and a portion not forming the plating resist is subjected to thick electrolytic plating and the plating resist is removed and etched to form a conductor circuit comprised of the electrolytic plated film and electroless plated film).

Moreover, the conductor circuit in the wiring substrate can improve the adhesion property to the interlaminar insulating resin layer to be formed on the conductor circuit by forming a roughened layer consisting of copper-nickel-phosphorus on the surface inclusive of at least a side surface.

The roughened layer is preferred to be formed by the electroless plating. The composition of the electroless plating solution is desirable to have a copper ion concentration of $2.2\times10^{-2}$–$4.1\times10^{-2}$ mol/l, a nickel ion concentration of $2.2\times10^{-3}$–$4.1\times10^{-3}$ mol/l and a hypophosphorous acid ion concentration of 0.20–0.25 mol/l, respectively. The film precipitated within the above range is needle in the crystal structure and is excellent in the anchor effect. Moreover, a complexing agent and additives may be added to the electroless plating bath in addition to the above compounds.

As the other method of forming the roughening layer, there is a method of subjecting the surface of the conductor circuit to oxidation (graphitization)-reduction, etching treatment or the like.

The roughened layer may be covered with a layer of metal or noble metal having an ionization tendency of more than copper but less than titanium. Such a metal or noble metal layer covering the roughened layer can prevent the dissolution of the conductor circuit due to a local electrode reaction created in the roughening of the interlaminar insulating resin layer. The thickness of this layer is 0.1–2 $\mu$m.

As the metal, there is at least one metal selected from titanium, aluminum, zinc, iron, indium, thallium, cobalt, nickel, tin, lead, bismuth and the like. As the noble metal, there are gold, silver, platinum and palladium. Among them, tin is preferable. Tin can form a thin layer through electroless substitution plating and can advantageously be followed to the roughened layer. In case of tin, a solution of tin borofluoride-thiourea or tin chloride-thiourea is used. In this case, Sn layer having a thickness of 0.1–2 $\mu$m is formed through Cu—Sn substitution reaction. In case of the noble metal, there are adopted sputtering method, vaporization method and the like.

In the core substrate are formed through-holes, and front wiring layer and back wiring layer are electrically connected to each other through the through-holes.

Further, a low viscosity resin such as bisphenol F-type epoxy resin or the like is filled in the through-hole and between the conductor circuits of the core substrate to ensure the smoothness of the wiring substrate.

(2) Then, an interlaminar resin insulating agent is applied to the wiring substrate prepared in the step (1).

As the interlaminar resin insulating agent is used the adhesive for electroless plating according to the present invention. In this case, roll coater, curtain coater and the like can be used for the application of the interlaminar resin insulating agent.

Moreover, in case of plural interlaminar insulating resin layers, the particle size of the heat-resistant resin particles in each of the layers may be changed. For example, the heat-resistant resin particles of the underlayer have an average particle size of 0.5 $\mu$m, and the heat-resistant resin particles of the upperlayer have an average particle sizes of 1.0 $\mu$m, whereby the adhesive for electroless plating may be constructed with heat-resistant resin particles having different particle sizes. Particularly, the heat-resistant resin particles of the underlayer have an average particle size of 0.1–2.0 $\mu$m, more preferably 0.1–1.0 $\mu$m.

Specifically, the material composition for the preparation of the adhesive for electroless plating according to the present invention may be mixed together just before applying and then applied as the adhesive for electroless plating.

Such adhesive for electroless plating is prepared by mixing the components of the material composition by means of roll kneading, ball mills or bees mills. For example, firstly, the components of the group 2 are mixed together and adjusted by means of roll kneading, ball mills or bees mills, and after mixing the components, the components of the group 1 and the curing agent of the group 3 are added to the mixture and mixed all together.

As the heat-resistant resin matric constituting the adhesive layer of the underlayer, there can be used a thermosetting resin, a thermosetting resin (a part or whole of thermosetting group is photosensitized), or a composite of thermosetting resin (a part or while of thermosetting group is photosensitized) and thermoplastic resin.

As the thermosetting resin constituting the adhesive layer of the underlayer, there can be used epoxy resin, phenolic resin, polyimide resin and the like. When a part of the thermosetting group is photosensitized, a part of the thermosetting group is acrylated by reacting with methacrylic acid, acrylic acid or the like. Among them, acrylated epoxy resin is optimum. As the epoxy resin, there can be used novolac type epoxy resin, alycyclic epoxy resin and the like.

As the thermoplastic resin constituting the adhesive layer of the underlayer, use may be made of polyether sulphone, polysulphone, polyphenylene sulphone, polyphenylene sulfide, polyphenyl ether, polyether imide and the like.

As the heat-resistant resin particle constituting the adhesive layer of the underlayer, use may be made of amino resin (melamine resin, urea resin, guanamine resin and the like), epoxy resin, bismaleimide-triazine resin and the like.

(3) The applied interlaminar resin insulating agent is dried.

At this time, the interlaminar insulating resin layer formed on the conductor circuit of the substrate has frequently a state of causing unevenness due to the fact that the thickness of the interlaminar insulating resin layer on the conductor circuit pattern is thin and the thickness of the interlaminar insulating resin layer on the conductor circuit having a large area is thick. Therefore, it is desirable that the surface of the interlaminar insulating resin layer is smoothened by pushing a metal plate or a metal roll onto the interlaminar insulating resin layer of the uneven state while heating.

(4) Next, an opening for the formation of viahole is formed in the interlaminar insulating resin layer while curing the interlaminar insulating resin layer.

The curing treatment of the interlaminar insulating resin layer is carried out by heat-curing when the resin matrix of the adhesive for electroless plating is a thermosetting resin, or by exposing to an ultraviolet ray or the like when it is a photosensitive resin.

The opening for the formation of viahole formed by using a laser beam or an oxygen plasma when the resin matrix of the adhesive for electroless plating is a thermosetting resin, or by light exposure and development when it is a photosensitive resin. Moreover, the light exposure and development are carried out after a photomask depicted with a circle pattern for the formation of the viahole (glass plate is favorable) is closely placed on the photosensitive interlaminar insulating resin layer so as to face the side of the circle pattern to the layer.

(5) The surface of the interlaminar insulating resin layer (adhesive for electroless plating) provided with the opening for the formation of the viahole is roughened.

In the present invention, the surface of the adhesive layer is particularly subjected to a roughening treatment by dissolving and removing the heat-resistant resin particles existing in the surface of the adhesive layer for electroless plating with acid or oxidizing agent. In this case, the depression depth of the roughened surface is preferred to be about 1–5 $\mu$m.

As the acid, there are phosphoric acid, hydrochloric acid, sulfuric acid and organic acids such as formic acid, acetic acid and the like. Particularly, the use of the organic acid is desirable. Because, it hardly corrodes the metal conductor layer exposed from the viahole in the roughening treatment.

As the oxidizing agent, it is desirable to use chromic acid, or permanganate (potassium permanganate or the like).

(6) Next, a catalyst nucleus is applied to the roughened surface of the interlaminar insulating resin layer.

In the application of the catalyst nucleus, it is desired to use a noble metal ion, a noble metal colloid or the like. In general, palladium chloride or palladium colloid is used. Moreover, it is desired to conduct a heating treatment for fixing the catalyst nucleus. As the catalyst nucleus, palladium is favorable.

(7) An electroless plated film is thinly formed on the full roughened surface of the interlaminar insulating resin layer.

As the electroless plated film, an electroless copper plated film is favorable and has a thickness of 1–5 $\mu$m, more particularly 2–3 $\mu$m. As the electroless copper plating solution, use may be made of any solution composition used in the usual manner. For example, a solution composition comprising copper sulfate: 29 g/l, sodium carbonate: 25 g/l, tartarate: 140 g/l, sodium hydroxide: 40 g/l, and 37% formaldehyde: 150 ml (pH=11.5).

(8) A photosensitive resin film (dry film) is laminated on the electroless plated film formed in the step (7) and a photomask (glass substrate is preferred) depicted with a plating resist pattern is closely placed thereonto, which is subjected to a light exposure and development to form a non-conductor portion forming the plating resist pattern.

(9) An electrolytic plated film is formed on the electroless plated film other than the non-conductor portion to form conductor circuits and conductor portion as a viahole.

As the electrolytic plating, it is desirable to use an electrolytic copper plating, and the thickness thereof is favorably 10–20 $\mu$m.

(10) After the plating resist on the non-conductor portion is removed, the electroless plated film is removed by dissolving in an etching solution such as a mixture of sulfuric acid and hydrogen peroxide, sodium persulfate, ammonium persulfate, iron chloride, copper chloride or the like to obtain independent conductor circuits consisting of the electroless plated film and the electrolytic plated film and viaholes. Moreover, the palladium catalyst nucleus on the roughened surface exposed from the non-conductor portion is dissolved and removed by chromic acid or the like.

(11) A roughened layer is formed on the surface of the conductor circuit and viahole formed in the step (10).

As the method of forming the roughened layer, there are etching treatment, polishing treatment, redox treatment or plating treatment.

The redox treatment is conducted by using an oxidation bath (graphitization bath) of NaOH (10 g/l), NaClO$_2$ (40 g/l) and Na$_3$PO$_4$ (6 g/l) and a reduction bath of NaOH (10 g/l) and NaBH$_4$ (5 g/l).

Furthermore, when the roughened layer is made from copper-nickel-phosphorus alloy layer, it is precipitated by the electroless plating. As the electroless alloy plating solution, it is favorable to use a plating bath of solution composition comprising copper sulfate: 1–40 g/l, nickel sulfate: 0.1–6.0 g/l, citric acid: 10–20 g/l, hypophosphite: 10–100 g/l, boric acid: 10–40 g/l and surfactant: 0.01–10 g/l.

(12) An interlaminar insulating resin layer is formed on the substrate according to the steps (2), (3).

(13) If necessary, the formation of multilayer is carried out by repeating the steps (4)–(10) to produce a multilayer circuit board.

[Full-Additive Process]

(1) The aforementioned steps (1)–(6) are carried out by using the adhesive for electroless plating according to the invention likewise the semi-additive process.

(2) A non-conductor portion forming the plating resist pattern is formed on the roughened surface of the interlaminar insulating resin layer (adhesive layer for electroless plating) provided with the catalyst nucleus.

The plating resist is formed by laminating a commercially available photosensitive dry film and subjecting to light exposure and development, or by applying a liquid plating resist composition with a roll coater or the like, drying, and subjecting to light exposure and development.

As the plating resist composition, it is desirable to use a photosensitive resin composition comprising a resin obtained by acrylating a novolac type epoxy resin such as cresol novolac type epoxy resin, phenol novolac type epoxy resin or the like with methacrylic acid or acrylic acid and an imidazole curing agent. Because, such a photosensitive resin composition is excellent in the resolution and resistance to base.

(3) An electroless plating is carried out on portions other than the non-conductor portion (plating resist portion) to form conductor circuit and conductor portion as a viahole. As the electroless plating, an electroless copper plating is favorable.

Moreover, when the opening for the formation of the viahole is filled by electroless plating to form so-called filled viahole, the surface of the conductor layer as an underlayer exposed from the opening for the formation of the viahole is first activated with acid before the catalyst nucleus is applied to the adhesive layer for electroless plating, which is immersed in an electroless plating solution. After the opening for the formation of viahole is filled by electroless plating, the catalyst nucleus is given to the adhesive layer for electroless plating and the plating resist is formed, which is subjected to an electroless plating to form a conductor layer.

The viahole formed by filling with the electroless plated film can form another viahole just thereabove, so that it is possible to make a size of a circuit board small and a density thereof high.

As means for improving the adhesion force between the conductor layer and the adhesive layer for electroless plating, there is a method wherein an alloy plating using at least two metal ions selected from copper, nickel, cobalt and phosphorus is applied as a primary plating and thereafter copper plating is applied as a secondary plating. These alloys are high in the strength and can improve the peel strength.

(4) A roughened layer is formed on upper surfaces of the conductor circuit formed other than the plating resist portion and the viaholes.

As the method for the formation of the roughened layer, there are etching treatment, polishing treatment, redox treatment and plating treatment.

Moreover, the roughened layer comprised of copper-nickel-phosphorus alloy layer is formed by precipitation through electroless plating.

(5) If necessary, interlaminar insulating layer as an upper-layer (adhesive layer for electroless plating) and conductor circuit are laminated to produce a multilayer circuit.

EXAMPLE 1

Semi-Additive Process: 0.5 $\mu$m (1) As a starting material, there is used a copper-clad laminate formed by laminating copper foils 8 of 18 $\mu$m onto both surfaces of a substrate 1 made from glass epoxy resin or BT (bismaleimide triazine) resin of 0.6 mm in thickness (see FIG. 1). At first, the copper-clad laminate is drilled and subjected to electroless plating and etched in a shape of pattern to form innerlayer conductor circuits 4 and a through-hole 9 on both surfaces of the substrate 1.

Figure 3:
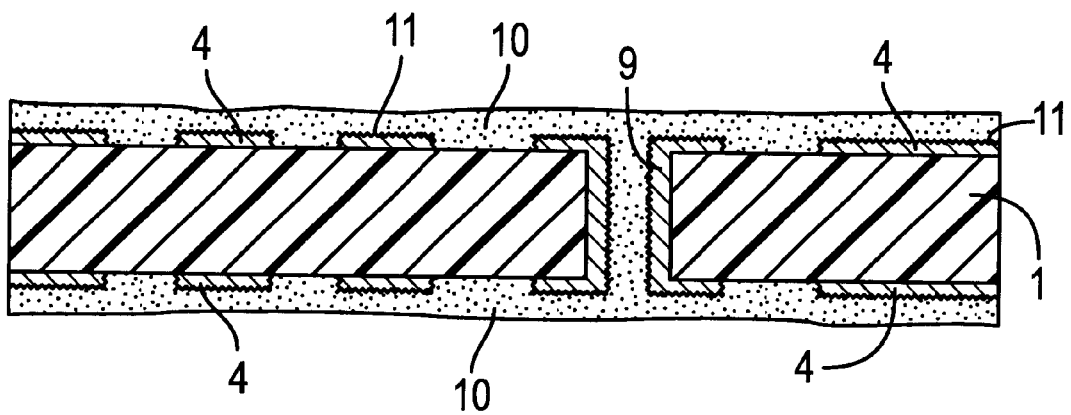
Figure 4:
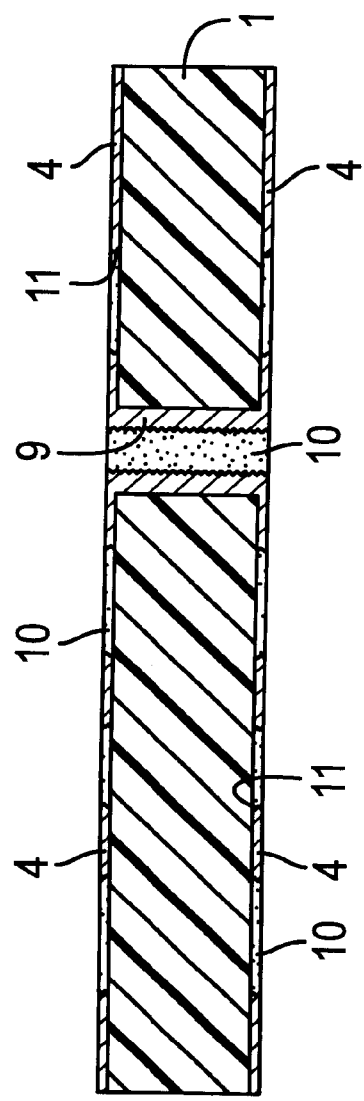

The surfaces of the innerlayer conductor circuits 4 and through-hole 9 are roughened by oxidation (graphitization)—reduction treatment (see FIG. 2), and bisphenol F-type epoxy resin as a filling resin 10 is filled between the conductor circuits and in the through-hole (see FIG. 3), and thereafter the surface of the substrate is smoothened by polishing so as to expose the surfaces of the conductor circuits and the land face of the through-hole (see FIG. 4).

(2) After the substrate subjected to the treatment of the step (1) is washed with water and dried, it is acidically degreased, soft-etched and treated with a catalyst solution of palladium chloride and organic acid to give a Pd catalyst. After the activation of the catalyst, it is subjected to a plating in an electroless plating bath containing 8 g/l of copper sulfate, 0.6 g/l of nickel sulfate, 15 g/l of citric acid, 29 g/l of sodium hypophosphite, 31 g/l of boric acid and 0.1 g/l of surfactant and having pH=9 to form a roughened layer 11 (uneven layer) of Cu—Ni—P alloy of 2.5 $\mu$m in thickness on the exposed surface of the copper conductor circuit.

Figure 5:
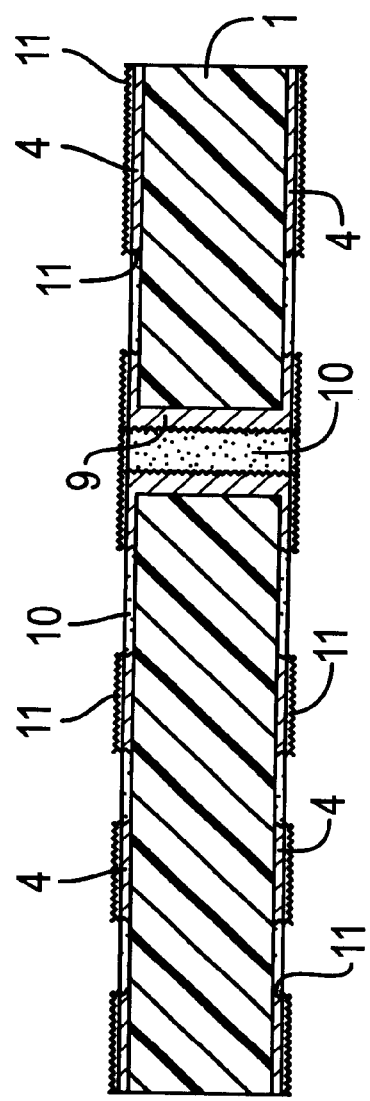

Further, the substrate is immersed in an electroless tin substitution plating bath containing 0.1 mol/l of tin borofluoride and 1.0 mol/l of thiourea at 50° C. for 1 hour to form a tin substitution plated layer of 0.3 $\mu$m in thickness on the surface of the roughened layer 11 (see FIG. 5, provided that the tin layer is not shown).

(3) A photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyl) isocyanurate (made by Toa Gosei Co., Ltd.; trade name: Aronix M315) as a photosensitive monomer, 2 parts by weight of a photoinitiator (made by Ciba Geigy, trade name: Irgaquar 907), 0.2 part by weight of a photosensitizer (made by Nippon Kayaku Co., Ltd.; trade name: DETX-S) and 25 parts by weight of epoxy resin particles (made by Sanyo Kasei Co., Ltd.; trade name: Polymerpole. The particle size distribution of these particles is shown in FIG. 25. An average particle size of these particles is 0.51 $\mu$m as a median size and has a standard deviation of 0.193. These particles are distributed within a range of 0.09–1.32 $\mu$m and a particle size in a peak of the particle size distribution is 0.58 $\mu$m and the peak is one as seen from FIG. 25. Moreover, the measurement of the particle size distribution is carried out by using Shimazu laser diffraction type particle size distribution measuring device SALD-2000 made by Shimazu Seisakusho.), adding with 30.0 parts by weight of NMP (normal methyl pyrolidone), adjusting a viscosity to 7 Pa·s in a homodisper agitating machine and then kneading through three rolls.

Figure 6A:
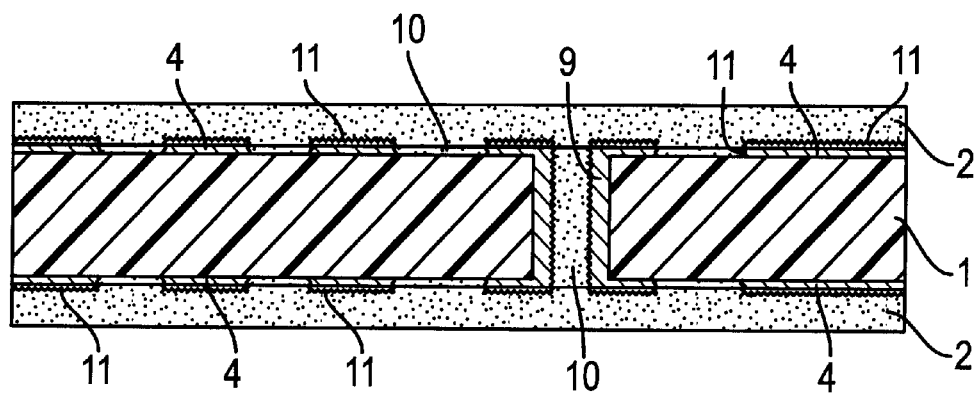

(4) The photosensitive adhesive solution obtained in the step (3) is applied onto both surfaces of the substrate treated in the step (2) by means of a roll coater and left to stand at horizontal state for 20 minutes and dried at 60° C. for 30 minutes to form an adhesive layer 2 of 60 $\mu$m (see FIG. 6(*a*)).

(5) A polyethylene terephthalate film (light permeation film) is attached to each surface of the adhesive layers 2 formed on both surfaces of the substrate in the step (4) through a tackifier. Then, a sodalime glass substrate of 5 mm in thickness depicted with the same circle pattern (mask pattern) as the viahole through a light screen ink of 5 $\mu$m in thickness is closely placed on the adhesive layer 2 so as to face the circle pattern depicted side thereto and exposed to an ultraviolet ray.

(6) The light-exposed substrate is developed by spraying a DMTG (triethylene glycol dimethyl ether) solution to form openings for viahole of 100 $\mu$m$\phi$ on the adhesive layer 2. Further, the substrate is exposed to a super-high pressure mercury lamp at 3000 mJ/cm$^2$ and heated at 100° C. for 1 hour and at 150° C. for 5 hours to form an adhesive layer 2 of 50 $\mu$m in thickness provided with openings 6 (opening for the formation of viahole) having excellent dimensional accuracy corresponding to the photomask film. Moreover, the roughened layer 11 is partly exposed in the opening 6 for the viahole (see FIG. 7).

Figure 8:
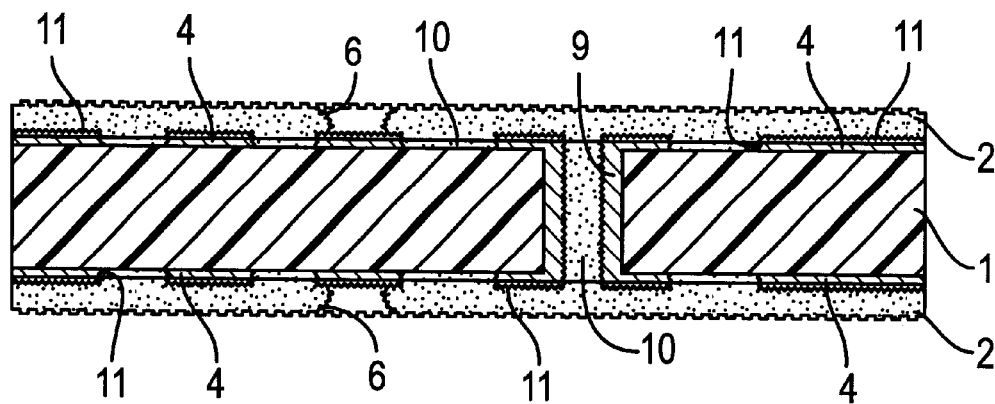

(7) The substrate having the openings 6 for the formation of viahole in the steps (5),(6) is immersed in chromic acid for 2 minutes to dissolve and remove epoxy resin particles existing in the surface area of the adhesive layer 2, whereby the surface of the adhesive layer 2 is roughened and then immersed in a neutral solution (made by Shipley) and washed with water (see FIG. 8).

(8) A catalyst nucleus is applied to the surfaces of the adhesive layer 2 and the opening 6 for the formation of viahole by giving a palladium catalyst (made by Atotech Co., Ltd.) To the substrate roughened in the step (7) (roughened depth: 5 μm).

Figure 9:
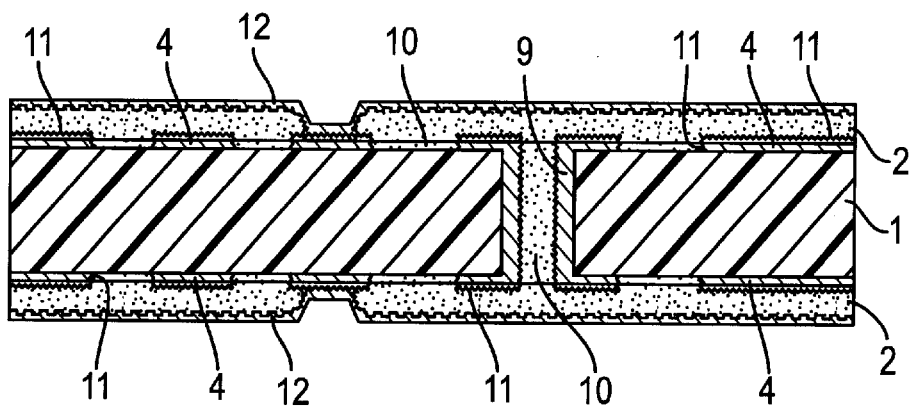

(9) The substrate is immersed in an electroless copper plating bath having the following composition to form an electroless copper plated film 12 of 3 μm in thickness over a full roughened surface (see FIG. 9).

| [Electroless plating solution] | |
| --- | --- |
| EDTA | 150 g/l |
| Copper sulfate | 20 g/l |
| HCHO | 30 ml/l |
| NaOH | 49 g/l |
| α,α'-bipyridyl | 80 mg/l |
| PEG | 0.1 g/l |

[Electroless Plating Condition]
at a liquid temperature of 70° C. for 30 minutes

Figure 10:
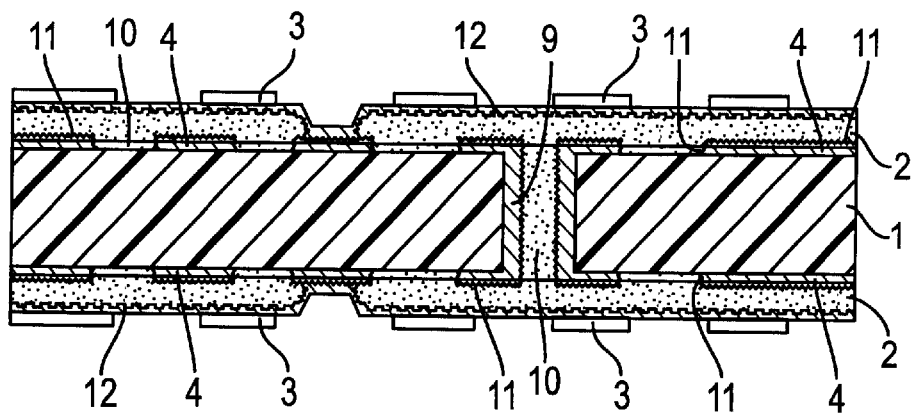

(10) A commercially available photosensitive resin film (dry film) is adhered to the electroless copper plated film 12 formed in the step (9) through thermal press and further sodalime glass substrate of 5 mm in thickness depicted with a mask pattern as a portion not forming the plating resist through chromium layer is closely placed onto the dry film so as to face the chromium layer side to the dry film, exposed to a light at 110 mJ/cm$^2$ and developed with 0.8% sodium carbonate to form a pattern of plating resist 3 having a thickness of 15 μm (FIG. 10).

Figure 11:
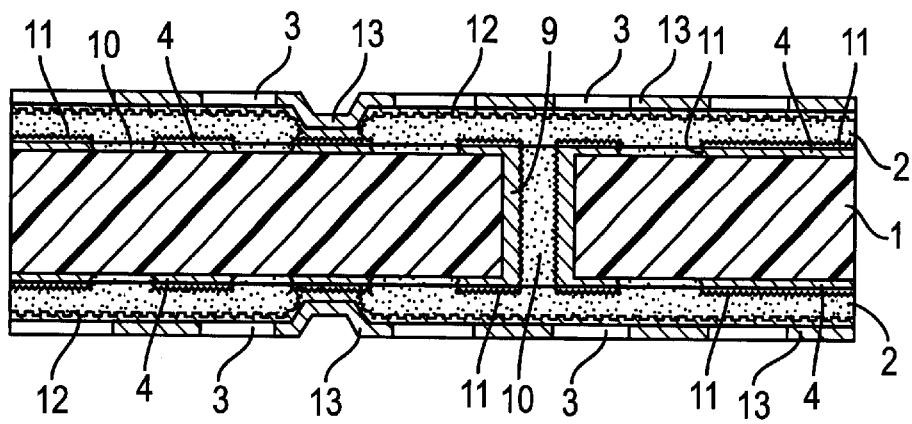

(11) Then, the portion not forming the plating resist is subjected to an electrolytic copper plating under the following conditions to form an electrolytic copper plated film 13 having a thickness of 15 μm (see FIG. 11).

| [Electrolytic plating solution] | |
| --- | --- |
| sulfuric acid | 180 g/l |
| copper sulfate | 80 g/l |
| additive (made by Atoteck Japan, trade name: Capalacid GL) | 1 ml/l |

| [Electrolytic plating solution] | |
| --- | --- |
| current density | 1.2 A/dm$^2$ |
| time | 30 minutes |
| temperature | Room temperature |

(12) After the plating resist 3 is peeled off by spraying 5% KOH, the electroless plated film 12 located beneath the plating resist 3 is dissolved and removed by etching with a mixed solution of sulfuric acid and hydrogen peroxide to form an innerlayer conductor circuit 5 consisting of the electroless copper plated film 12 and the electrolytic copper plated film 13 and having a thickness of 18 μm. Further, Pd retained in the roughened surface 11 is removed by immersing in chromic acid (800 g/l) for 1–2 minutes (see FIG. 12).

(13) The substrate provided with the conductor circuit 5 is immersed in an electroless plating solution of pH=9 containing 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phosphorus having a thickness of 3 μm on the surface of the conductor circuit 5. In this case, the roughened layer 11 has a composition ratio of Cu: 98 mol %, Ni: 1.5% and P: 0.5 mol % as analyzed by EPMA (fluorescent X-ray analyzing device).

Figure 13:
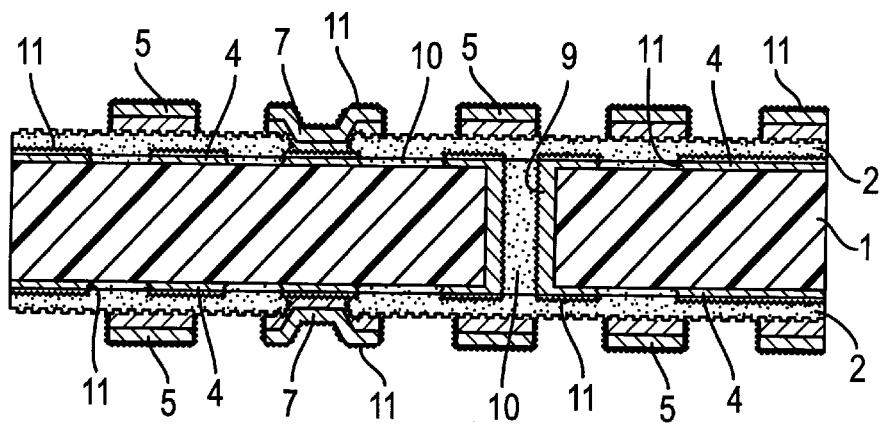

Further, the substrate is washed with water and immersed in an electroless tin substitution plating bath containing 0.1 mol/l of tin borofluoride and 1.0 mol/l of thiourea at 50° C. for 1 hour to form a tin substitution plated layer of 0.3 μm on the surface of the roughened layer 11 (see FIG. 13 provided that tin substituted layer is not shown).

Figure 14:
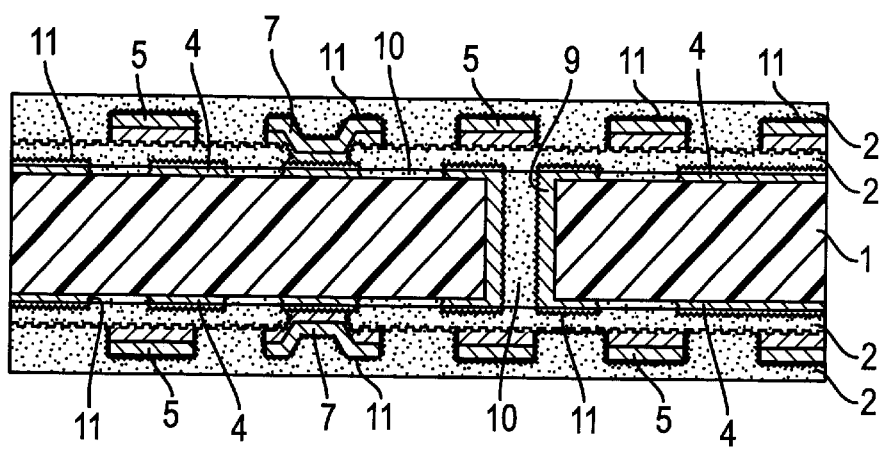
Figure 15:
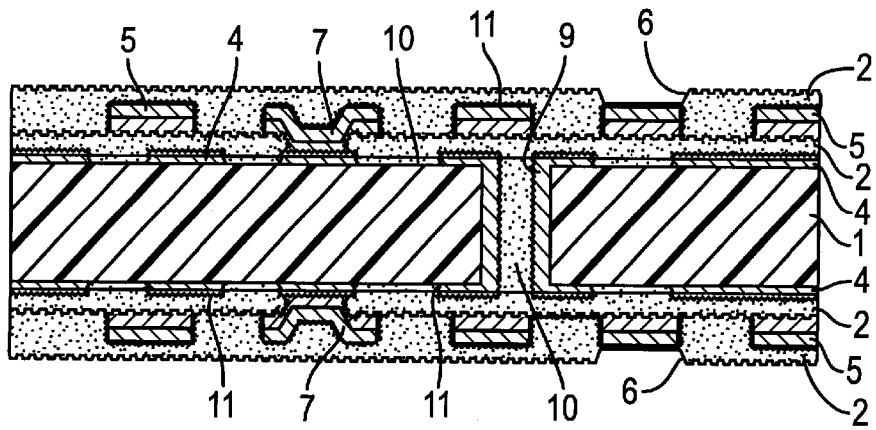
Figure 16:
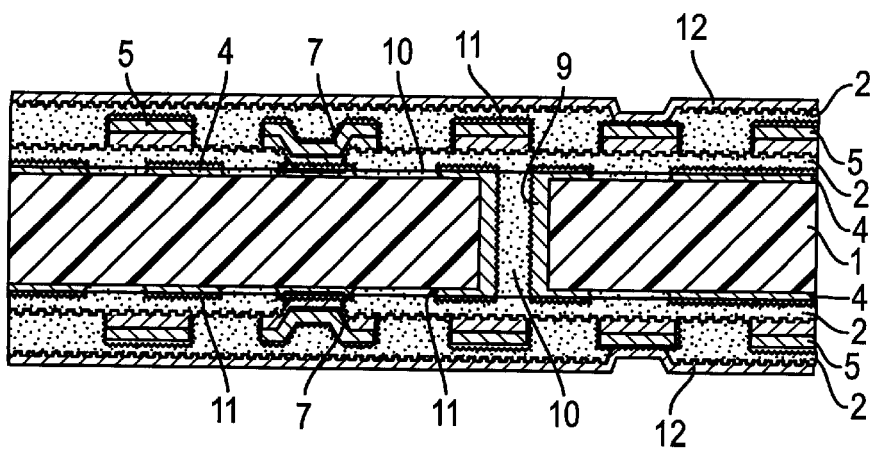
Figure 17:
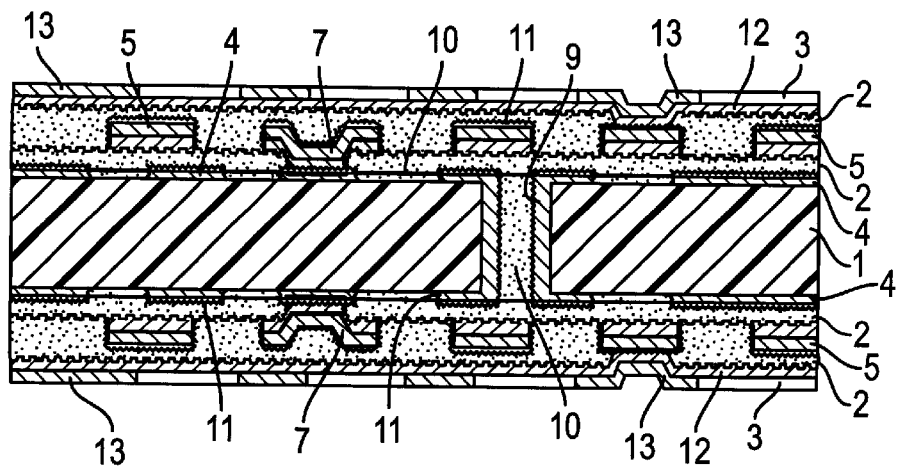
Figure 18:
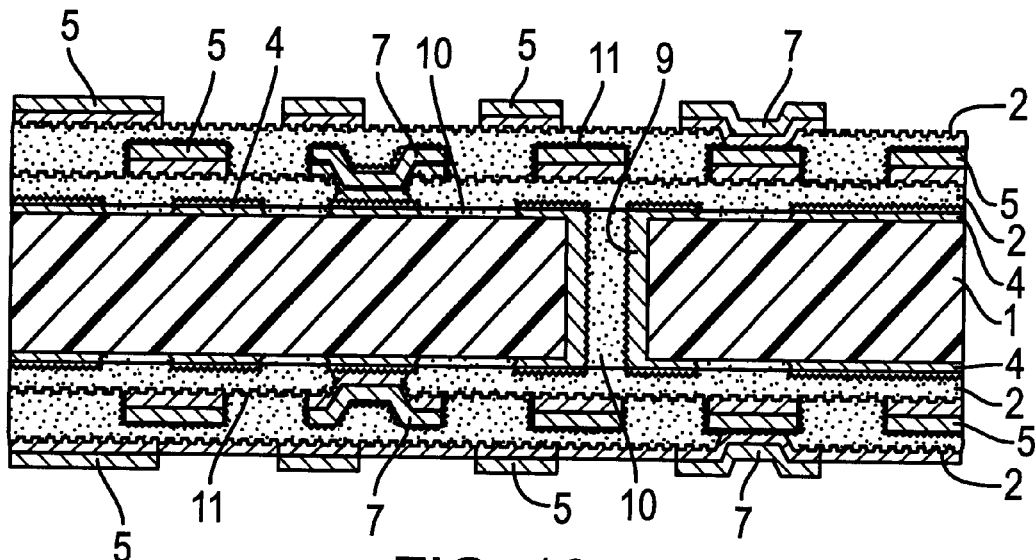
Figure 19:
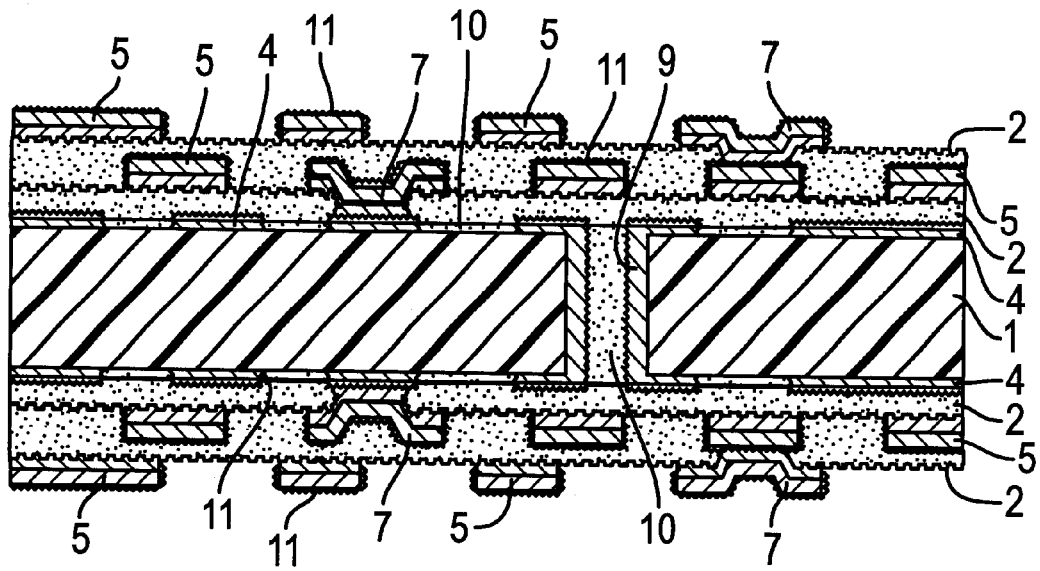

(14) An adhesive layer 2 is further formed according to the step (4) and a polyethylene terephthalate film (light permeation film) is attached to the surface thereof, which is sandwiched between stainless plates and heat-pressed by heating in a heating furnace at 65° C. while pressurizing at 20 kgf/cm$^2$. By such a heat pressing is smoothened the surface of the adhesive layer 2 to form an interlaminar insulating resin layer (see FIG. 14).

(15) Further, conductor circuits are formed by repeating the steps (5)–(13) and a roughened layer 11 of copper-nickel-phosphorus is formed on the surface of the conductor circuit. In this case, the tin substitution plated layer is not formed on the surface of the roughened layer (see FIGS. 15–19).

(16) On the other hand, a solder resist composition is prepared by mixing 46.67 parts by weight of a photosensitized oligomer (molecular weight: 4000) obtained by acrylating 50% of epoxy group of 60% by weight of creasol novolac type epoxy resin (made by Nippon Kayaku Co., Ltd.) dissolved in DMDG, 15.0 parts by weight of 80% by weight of bisphenol A-type epoxy resin (made by Yuka Shell Co., Ltd.; trade name: Epikote 1001) dissolved in methyl ethyl ketone, 1.6 parts by weight of imidazole curing agent (made by Shikoku Kasei Co., Ltd.; trade name: 2E4MZ-CN), 3 parts by weight of polyvalent acrylmonomer (made by Nippon Kayaku Co., Ltd.; trade name: R604) as a photosensitive monomer, 1.5 parts by weight of a polyvalent acrylmonomer (made by Kyoeisha Kagaku Co., Ltd.; trade name: DPE6A) and 0.71 part by weight of a dispersion anti-foamer, adding 2 parts by weight of benzophenone (made by Kanto Kagaku Co., Ltd.) as a photoinitiator and 0.2 part by weight of Michler s ketone (made by Kanto Kagaku Co., Ltd.) as a photosensitizer to the mixture and adjusting a viscosity to 2.0 Pa·s at 25° C.

Moreover, the measurement of the viscosity is carried out by B-type viscosity meter (made by Tokyo Keiki Co., Ltd.; DVL-B model) according to rotor No. 4 at 60 rpm and rotor No. 3 at 6 rpm.

(17) The above solder resist composition is applied to both surfaces of the substrate obtained in the step (15) at a thickness of 20 μm. Then, it is dried at 70° C. for 20 minutes and at 70° C. for 30 minutes and thereafter a sodalime glass substrate of 5 mm in thickness depicted with circle patter (mask pattern) for solder resist opening through chromium layer is closely placed on the solder resist layer so as to face the chromium layer side thereto, exposed to an ultraviolet ray at 1000 mJ/cm$^2$ and developed with DMTG.

Further, it is heated at 80° C. for 1 hour, at 100° C. for 1 hour, at 120° C. for 1 hour and at 150° C. for 3 hours to form a pattern of solder resist layer 14 (thickness: 20 μm) opening in the upper surface of the solder pad, viahole and its land portion (opening size: 200 μm).

(19) The substrate provided with the solder resist layer 14 is immersed in an electroless nickel plating solution of pH=5 containing 30 g/l of nickel chloride, 10 g/l of sodium hypophosphite and 10 g/l of sodium citrate to form a nickel plated layer 15 of 5 μm in the opening. Further, the substrate is immersed in an electroless gold plating solution containing 2 g/l of potassium gold cyanide, 75 g/l of ammonium chloride, 50 g/l of sodium citrate and 10 g/l of sodium hypophosphite at 93° C. for 23 seconds to form a gold plated layer 16 of 0.03 μm on the nickel plated layer 15.

Figure 20:
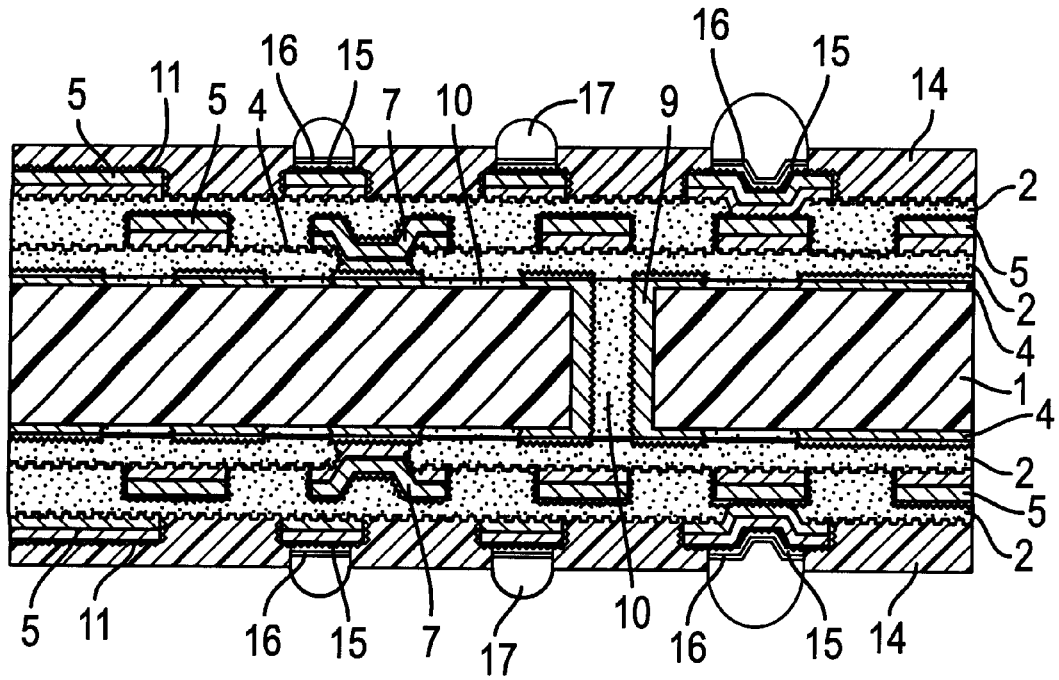

(20) A solder paste is printed on the opening of the solder resist layer 14 and reflowed at 200° C. to form a solder bump (solder body) 17, whereby there is produced a printed circuit board having solder bumps (see FIG. 20).

EXAMPLE 2
Semi-Additive Process: 0.92 μm

A printed circuit board having solder bumps is produced in the same manner as in Example 1 except that the following adhesive solution for electroless plating is used.

That is, a photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4M-CN), 4 parts by weight of caprolactone modified tris (acroxyethyl) isocyanurate (made by Toa Gosei Co., Ltd.; trade name: Aronix M315) as a photosensitive monomer, 2 parts by weight of a photoinitiator (made by Ciba Geigy, trade name: Irgaquar 907), 0.2 part by weight of a photosensitizer (made by Nippon Kayaku Co., Ltd.; trade name: DETX-S) and 25 parts by weight of epoxy resin particles (made by Sanyo Kasei Co., Ltd.; trade name: Polymerpole SS-001. The particle size distribution of these particles is shown in FIG. 26. An average particle size of these particles is 0.92 μm as a median size and has a standard deviation of 0.275. These particles are distributed within a range of 0.10–1.98 μm and a particle size in a peak of the particle size distribution is 1.00 μm and the peak is one as seen from FIG. 26. Moreover, the measurement of the particle size distribution is carried to by using Shimazu laser diffraction type particle size distribution measuring device SALD-2000 made by Shimazu Seisakusho.), adding with 30.0 parts by weight of NMP (normal methyl pyrolidone), adjusting a viscosity to 7 Pa·s in a homodisper agitating machine and then kneading through three rolls.

EXAMPLE 3
Full-Additive Process (1) A photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethy ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyl) isocyanurate (made by Toa Gosei Co., Ltd.; trade name: Acronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S) and 30.0 parts by weight of epoxy resin particles (made by Sanyo Kasei Co., Ltd.; trade name: Polymerpole S-031. The particle size distribution of these particles is shown in FIG. 25. An average particle size of these particles is 0.51 μm as a median size and has a standard deviation of 0.193. These particles are distributed within a range of 0.09–1.32 μm and a particle size in a peak of the particle size distribution is 0.58 μm and the peak is one as seen from FIG. 25. Moreover, the measurement of the particle size distribution is carried to by using Shimazu laser diffraction type particle size distribution measuring device SALD-2000 made by Shimazu Seisakusho.), adding 30.0 parts by weight of NMP (normal methyl pyrolidone), adjusting a viscosity to 7 Pa·s in a homodisper agitating machine and kneading through three rolls.

(2) The adhesive solution for electroless plating obtained in the step (1) is applied to both surfaces of a core substrate by means of a roll coater according to the steps (1), (2) of Example 1, left to stand at horizontal state for 20 minutes and dried at 60° C. for 30 minutes to form an adhesive layer 2 having a thickness of 60 μm.

(3) A polyethylene terephthalate film (light permeation film) is attached onto the adhesive layer 2 formed on each surface of the substrate in the step (2) through a tackifier. Then, sodalime glass substrate of 5 mm in thickness depicted with the same circle pattern (mask pattern) as the viahole through a light screen ink of 5 μm in thickness is closely placed onto the adhesive layer 2 so as to face the circle pattern side thereto and exposed to an ultraviolet ray.

(4) The exposed substrate is developed by spraying DMTG (triethylene glycol dimethyl ether) solution to from an opening of 100 μm as a viahole in the adhesive layer 2. Further, the substrate is exposed to a super-high pressure mercury lamp at 3000 mJ/cm$^2$ and heated at 100° C. for 1 hour and at 150° C. for 5 hours to form an adhesive layer 2 of 45 μm in thickness provided with the opening 6 (opening for the formation of viahole) having excellent dimensional accuracy corresponding to the photomask. Moreover, the roughened layer 11 is partly exposed in the opening 6 as a viahole (see FIG. 7).

(5) The substrate provided with the opening 6 for the formation of viahole is immersed in chromic acid for 2 minutes to dissolve and remove the epoxy resin particles existing in the surface area of the adhesive layer 2, whereby the surface of the adhesive layer 2 is roughened and then immersed in a neutral solution (made by Shipley) and washed with water (see FIG. 8).

(6) On the other hand, a mixed solution A is prepared by mixing 46.7 parts by weight of a photosensitized oligomer obtained by acrylating 50% of epoxy group in cresol novolac type epoxy resin (made by Nippon Kayaku Co., Ltd.; trade name: ECON-103S) dissolved in DMDG, 15.0 parts by weight of 80 parts by weight of bisphenol A-type epoxy resin (made by Yuka Shell Co., Ltd.; trade name: Epikote 1001) dissolved in methyl ethyl ketone), 1.6 parts by weight of imidazole curing agent (made by Shikoku Kasei Co., Ltd.; trade name: 2E4MZ-CN), 3 parts by weight of a polyvalent acrylate (made by Nippon Kayaku Co., Ltd.; trade name: R-604) as a photosensitive monomer and 1.5 parts by weight of polyvalent acryl monomer (made by Kyoei Kagaku Co., Ltd.; trade name: DPE-6A), adding 0.5 part by weight of apolymer of acrylic ester (made by Kyoei Kagaku Co., Ltd.; trade name: Polyflow 75) to total weight of the resulting mixture and agitating them.

Further, a mixed solution B is prepared by dissolving 2 parts by weight of benzophenone (made by Kanto Kagaku Co., Ltd.) as a photoinitiator and 0.2 part by weight of Michler's ketone (made by Kanto Kagaku Co., Ltd.) As a photosensitizer in 3 parts by weight of DMDG warmed at 40° C.

Then, the mixed solution A is mixed with the mixed solution B to form a liquid resist.

Figure 21:
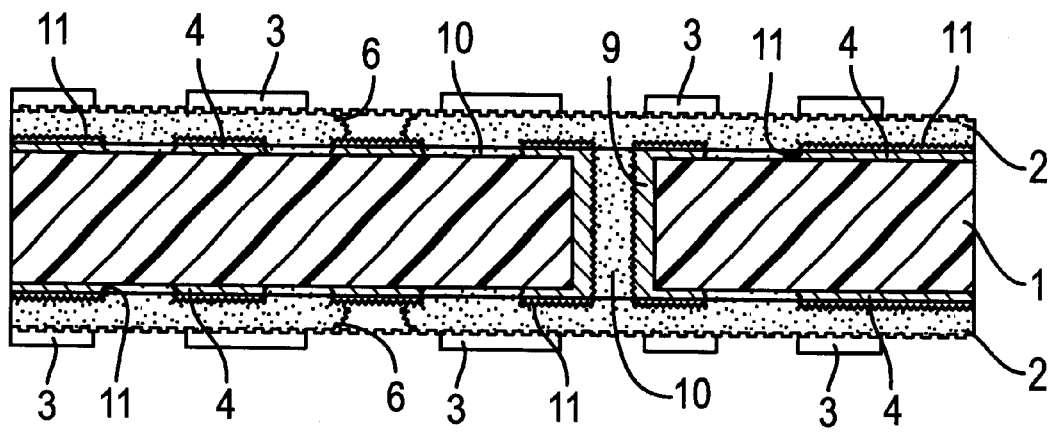
FIGS. 21–24 are diagrammatic views illustrating procsses in the production of the multilayer printed circuit board through additive process using the adhesive for electroless plating according to the present invention.

(7) The liquid resist is applied onto the substrate treated in the step (5) by means of a roll coater and dried at 60° C. for 30 minutes to form a resist layer having a thickness of 30 μm. Then, a mask film depicted with a conductor circuit pattern of L/S (ratio of line to space)=50/50 is closed, exposed to a super-high pressure mercury lamp at 1000 mJ/cm² and developed by spraying DMDG to form a plating resist removing the conductor circuit pattern portion in the substrate, which is further exposed to a super-high pressure mercury lamp at 6000 mJ/cm² and heated at 100° C. for 1 hour and at 150° C. for 3 hours to form a permanent resist 3 on the adhesive layer 2 (interlaminar insulating resin layer) (see FIG. 21).

(8) The substrate provided with the permanent resist 3 is immersed in an aqueous solution of 100 g/l of sulfuric acid to activate a catalyst nucleus, which is subjected to a primary plating in an electroless copper-nickel alloy plating bath having the following composition to form a thin plated film of copper-nickel-phosphorus alloy having a thickness of about 1.7 μm on the portion not forming the resist. In this case, the temperature of the plating bath is 60° C. and the plating time is 1 hour.

| Metal salts | $CuSO_4\ 5H_2O$ | : 6.0 mM (1.5 g/l) |
|---|---|---|
| | $NiSO_4\ 6H_2O$ | : 95.1 mM (25 g/l) |
| complexing agent | $Na_3C_6H_5O_7$ | : 0.23 M (60 g/l) |
| Reducing agent | $NaPH_2O_2\ H_2O$ | : 0.19 M (20 g/l) |
| pH adjusting agent | NaOH | : 0.75 M (pH = 9.5) |
| Stabilizer | lead nitrate | : 0.2 M (80 ppm) |
| Surfactant | | : 0.05 g/l |

Moreover, the precipitation rate is 1.7 μm/h.

Figure 22:
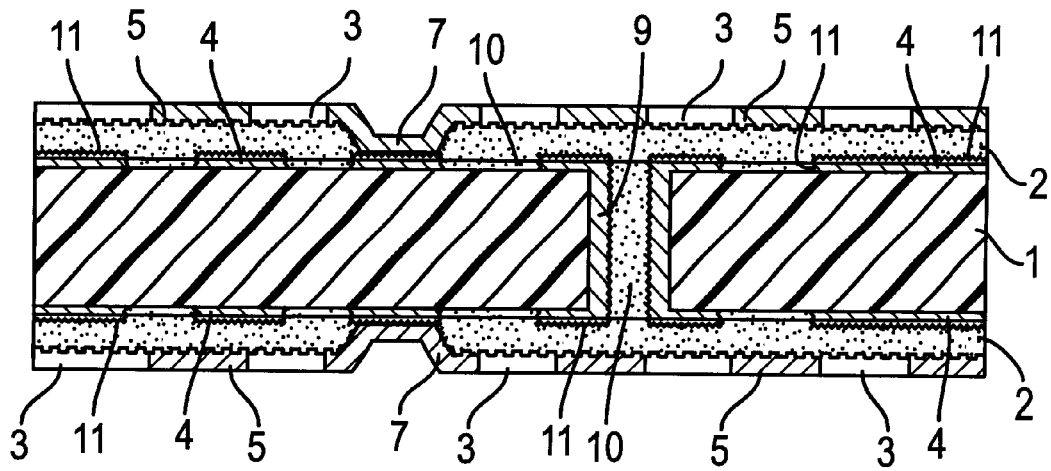

(9) The substrate subjected to the primary plating is taken out from the plating bath, washed with water to remove the plating solution adhered to the surface and further treated with an acidic solution to remove oxide film on the surface layer of copper-nickel-phosphorus thin plated film. Thereafter, the copper-nickel-phosphorus thin plated film is subjected to a secondary plating in an electroless copper plating bath having the following composition without Pd substitution to form outerlayer conductor pattern required as a conductor in additive process and viahole (BVH) (see FIG. 22). In this case, the temperature of the plating bath is 50–70° C. and the plating time is 90–360 minutes.

| Metal salt | CuSO4 5H2O | : 8.6 mM |
|---|---|---|
| Complexing agent | TEA | : 0.15 M |
| Reducing agent | HCHO | : 0.02 M |
| Others | stabilizer | : small amount |
| | (bipyridyl, potassium ferrocyanide and the like) | |
| Precipitation rate | | : 6 μm/h |

(10) After the conductor layer is formed by additive process, the one-side surface of the substrate is polished by belt sander polishing with a #600 belt polishing paper so as to align the upper surface of the permanent resist, the upper surface of the conductor circuit and the upper land surface of the viahole to each other. Subsequently, buffing is carried out for removing the scratch produced by the belt sander (only the buffing may be sufficient). The other side surface is subjected to the same polishing as mentioned above to obtain a printed wiring substrate, both surfaces of which being smooth.

Figure 23:
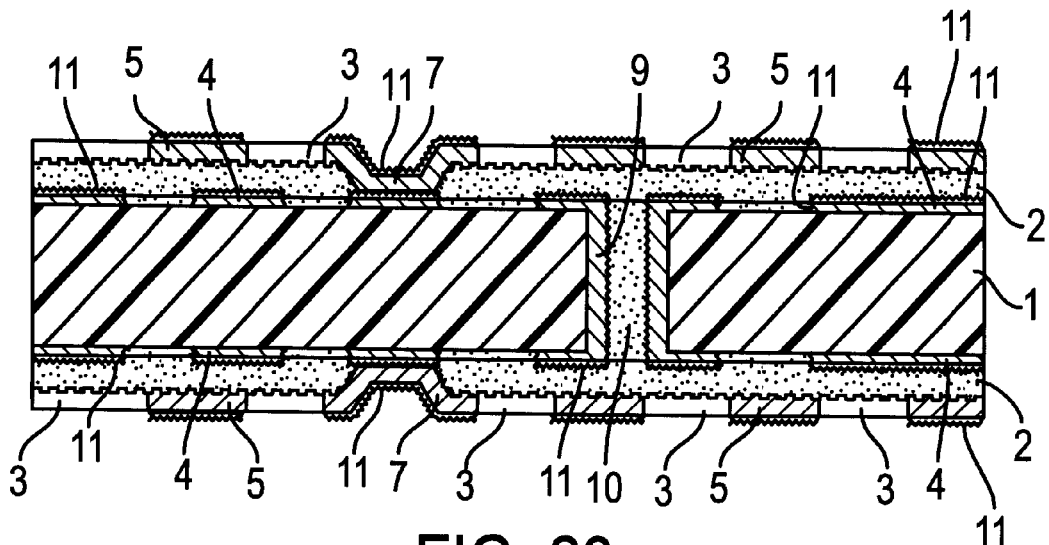

(11) The surface-smoothened printed wiring substrate is immersed in an electroless plating solution of pH=9 containing 8 g/l of copper sulfate, 0.6 g/l of nickel sulfate, 15 g/l of citric acid, 29 g/l of sodium hypophosphorite, 31 g/l of boric acid and 0.1 g/l of surfactant to form a roughened layer 11 of copper-nickel-phosphorus alloy having a thickness of 3 μm on the surface of the conductor exposed from the surface of the substrate (see FIG. 23).

Thereafter, a conductor layer is further formed through additive process by repeating the above steps to form another wiring layer. In this way, there is provided a multilayer printed circuit board having 6 wiring layers.

Figure 24:
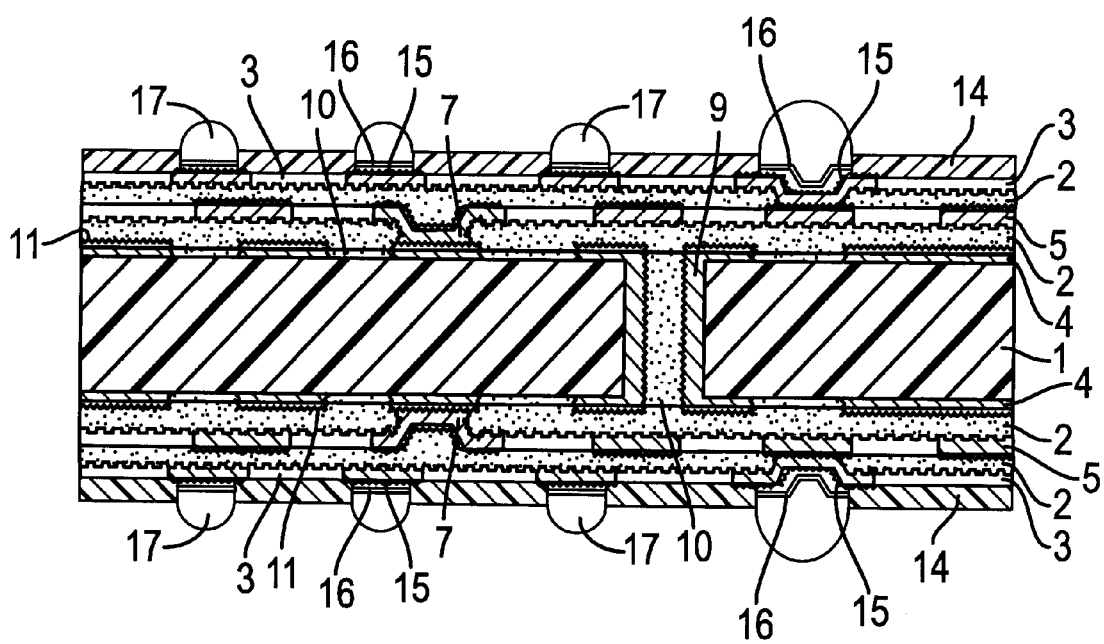

(12) Further, a solder resist layer 14 and a solder bump 17 are formed according to the steps (16)–(20) of Example 1 to produce a printed circuit board having solder bumps 17 (see FIG. 24).

COMPARATIVE EXAMPLE 1

Semi-Additive Process (3.9 μm/0.5 μm)

The printed circuit board having solder bumps is produced in the same manner as in Example 1 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris(acroxyethyl) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S), 10 parts by weight of epoxy resin particles having an average particle size of 3.9 μm and 25 parts by weight of the epoxy resin particles having an average particle size of 0.5 μm (made by Toray Co., Ltd.; trade name: Toreparle), adding 30.0 parts by weight of NMP (normal methyl pyrolidone), adjusting a viscosity to 7 Pa·s in a homodisper agitating machine and kneading through three rolls.

COMPARATIVE EXAMPLE 2

Semi-Additive Process (1.6 μm ground powder+epoxy/PES matrix)

(1) Epoxy resin particles are prepared according to a method described in JP-A-61-276875 (U.S. Pat. No. 4,752,499 and U.S. Pat. No. 5,921,472).

That is, epoxy resin (made by Mitsui Petrochemical Industries, Ltd.; trade name: TA-1800) is cured by drying in a hot air dryer at 180° C. for 4 hours and the cured epoxy resin is roughly ground and sieved by using a supersonic jet grinding machine (made by Nippon Pneumatic Kogyo Co., Ltd.; trade name: Aqucut B-18 model) while freezing with a liquid nitrogen, whereby there are prepared epoxy resin particles having an average particle size of 1.6 μm.

(2) The production of the printed circuit board is carried out in the same manner as in Example 1 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyle) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S) and 35 parts by weight of the epoxy resin particles of the above step (1) having an average particle size of 1.6 $\mu$m, adding 30.0 parts by weight of NMP (normal methyl pyrolidone), adjusting a viscosity to 7 Pa·s in a homodisper agitating machine and then kneading through three rolls.

COMPARATIVE EXAMPLE 3

Semi-Additive Process 1.6 $\mu$m particles+epoxy/PES matrix

The printed circuit board having solder bumps is produced in the same manner as in Example 1 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyle) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S) and 35 parts by weight of the epoxy resin particles (made by Toray Co., Ltd.; trade name: Toreparle) having an average particle size of 1.6 $\mu$m, adding 30.0 parts by weight of NMP (normal methyl pyrolidone), adjusting a viscosity to 7 Pa·s in a homodisper agitating machine and then kneading through three rolls.

COMPARATIVE EXAMPLE 4

Full-Additive Process (3.9 $\mu$m/0.5 $\mu$m)

The printed circuit board having solder bumps is produced in the same manner as in Example 3 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyle) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S), 10 parts by weight of the epoxy resin particles (made by Toray Co., Ltd.; trade name: Toreparle) having an average particle size of 3.9 $\mu$m and 25 parts by weight of the epoxy resin particles having an average particle size of 0.5 $\mu$m, adding 30.0 parts by weight of NMP (normal methyl pyrolidone), adjusting a viscosity to 7 Pa·s in a homodisper agitating machine and then kneading through three rolls.

COMPARATIVE EXAMPLE 5

Full-Additive Process 1.6 $\mu$m ground powder+epoxy/PES matrix (1) Epoxy resin particles are prepared according to a method described in JP-A-61-276875.

That is, epoxy resin (made by Mitsui Petrochemical Industries, Ltd.; trade name: TA-1800) is cured by drying in a hot air dryer at 180° C. for 4 hours and the cured epoxy resin is roughly ground and sieved by using a supersonic jet grinding machine (made by Nippon Pneumatic Kogyo Co., Ltd.; trade name: Aqucut B-18 model) while freezing with a liquid nitrogen, whereby there are prepared epoxy resin particles having an average particle size of 1.6 $\mu$m.

(2) The production of the printed circuit board is carried out in the same manner as in Example 3 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyle) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S) and 35 parts by weight of the epoxy resin particles of the above step (1) having an average particle size of 1.6 $\mu$m, adding 30.0 parts by weight of NMP (normal methyl pyrolidone), adjusting a viscosity to 7 Pa·s in a homodisper agitating machine and then kneading through three rolls.

COMPARATIVE EXAMPLE 6

Full-Additive Process 1.6 $\mu$m particles+epoxy/PES matrix

The printed circuit board having solder bumps is produced in the same manner as in Example 3 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 4 parts by weight of caprolactone modified tris (acroxyethyle) isocyanurate (made by Toa Gosei Co., Ltd.; trade name: Aronix M315) as a photosensitive monomer, 2 parts by weight of a photoinitiator (made by Ciba Geigy trade name: Irgaquar 907), 0.2 part by weight of a photosensitizer (made by Nippon Kayaku Co., Ltd.; trade name: DETX-S) and 35 parts by weight of the epoxy resin particles (made by Toray Co., Ltd.; trade name: Toreparle) having an average particle size of 1.6 μm, adding 30.0 parts by weight of NMP (normal methyl pyrolidone), adjusting a viscosity to 7 Pa·s in a homodisper agitating machine and then kneading through three rolls.

COMPARATIVE EXAMPLE 7

Semi-Additive Process 5.5 μm/0.5 μm (JP-A-7-34048, U.S. Pat. No. 5,519, 177)

The printed circuit board having solder bumps is produced in the same manner as in Example 1 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight:2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 5 parts by weight of trimethyl triacrylate (TMPTA) as a photosensitive monomer, 2 parts by weight of a photoinitiator (made by Ciba Geigy trade name: Irgaquar 907), 10 parts by weight of the epoxy resin particles (made by Toray Co., Ltd.; trade name: Toreparle) having an average particle size of 5.5 μm and 5 parts by weight of the epoxy resin particles having an average particle size of 0.5 μm, adding 30.0 parts by weight of NMP (normal methyl pyrolidone), adjusting a viscosity to 7 Pa·s in a homodisper agitating machine and then kneading through three rolls.

COMPARATIVE EXAMPLE 8

Full-Additive Process 5.5 μm/0.5 μm (JP-A-7-34048, U.S. Pat. No. 5,519, 177)

The printed circuit board having solder bumps is produced in the same manner as in Example 3 except that the following adhesive solution for electroless plating is used.

That is, the photosensitive adhesive solution for electroless plating (interlaminar resin insulating agent) is prepared by mixing 34 parts by weight of 25% acrylated product of cresol novolac type epoxy resin (made by Nippon Kayaku Co., Ltd.; molecular weight: 2500) dissolved in DMDG (diethylene glycol dimethyl ether), 12 parts by weight of polyether sulphone (PES), 2 parts by weight of imidazole curing agent (made by Shikoku Kasei Co., Ltd.; trade name: 2E4MZ-CN), 5 parts by weight of trimethyl triacrylate (TMPTA) as a photosensitive monomer, 2 parts by weight of a photoinitiator (made by Ciba Geigy trade name: Irgaquar 907), 10 parts by weight of the epoxy resin particles (made by Toray Co., Ltd.; trade name: Toreparle) having an average particle size of 5.5 μm and 5 parts by weight of the epoxy resin particles having an average particle size of 0.5 μm, adding 30.0 parts by weight of NMP (normal methyl pyrolidone), adjusting a viscosity to 7 Pa s in a homodisper agitating machine and then kneading through three rolls.

EXAMPLE 4

Example using material composition for the preparation of the adhesive each preserved in separated manner.

The printed circuit board is produced in the same manner as in Example 1 except that the adhesive for electroless plating is prepared by the following groups 1–3 of material compositions.

A. Material compositions for the preparation of adhesive for electroless plating(adhesive for upper layer).
    <Group 1>
    35 parts by weight of 25% acrylated product of cresol novolac type epoxy resin (2500 in molecular weight, made by Nippon Kayaku Co., Ltd.) as a 80% by weight solution in DMDG(diethylene glycol dimethyl ether), 4 parts by weight of a photosensitive monomer(made by Toa Gosei Co., Ltd.,trade name: Aronix M315), 0.5 parts by weight of antiforming agent (made by SANNOPCO, tradename: S-65), and 3.6 parts by weight of NMP are mixed together by agitation to obtain group 1 composition.
    <Group 2>
    8 parts by weight of polyether sulfone (PES), 7.245 parts by weight of epoxy resin having an average particle size of 0.5 μm (POLYMERPOLE by Sanyo Kasei Co., Ltd.) are mixed together and then 20 parts by weight of NMP were added to the mixture. They are mixed together by agitation to obtain group 2 composition.
    <Group 3>
    2 parts by weight of imidazole curing agent (2E4MZ-CN by Shikoku Kasei Co., Ltd.), 2 parts by weight of photoinitiator (IRGACURE I-907 by Ciba Geigy), 0.2 part by weight of photosensitizer (DETX-S by Nippon Kayaku Co., Ltd.) and 1.5 parts by weight of NMP are mixed together by agitation to obtain group 3 composition.

These compositions of groups 1–3 are preserved in a separated manner to one another at the temperature of 25° C. a month.

B. Material Compositions for the preparation of interlaminar insulating resin agent(adhesive for lower layer).
    <Group 1>
    35 parts by weight of 25% acrylated product of cresol novolac type epoxy resin (2500 in molucular weight, by Nippon Kayaku Co., Ltd.) as a 80% by weight solution in DMDG (diethylene glycol dimethyl ether), 4 parts by weight of a photosensitive monomer(made by Toa Gosei Co., Ltd.,trade name: Aronix M315), 0.5 parts by weight of antiforming agent(made by SANNOPCO, tradename: S-65), and 3.6 parts by weight of NMP, are mixed together by agitation to obatin group 1 composition.
    <Group 2>
    8 parts by weight of polyether sulfone (PES), 14.49 parts by weight of epoxy resin having the average particle size of 0.5 μm (POLYMERPOLE by Sanyo Kasei Co., Ltd.) are mixed together and then 30 parts by weight of NMP are added to the mixture. They are mixed together by agitation to obtain group 2 composition.
    <Group 3>
    2 parts by weight of imidazole curing agent (2E4MZ-CN by Shikoku Kasei Co., Ltd.), 2 parts by weight of photoinitiator (IRGACURE I-907 by Ciba Geigy), 0.2 part by weight of photosensitizer(DETX-S by Nippon Kayaku Co., Ltd.) and 1.5 parts by weight of NMP are mixed together by agitation to obtain group 3 composition.

These compositions of groups 1–3 are preserved in a separated manner to one another at the temperature of 25° C. for a month.

C. Material Compositions for the preparation of resin filler.
<Group 1>

100 parts by weight of a bisphenol F type epoxy monomer (manufactured by Yuka Shell Co., Ltd., 310 in molecular weight, tradename: YL983U), 170 parts by weight of spherical $SiO_2$ particles (manufactured by Admatech Co., Ltd., tradename: CRS 1101-CE, where the maximum particle size is set to below the thickness (15 μm) of an internal layer copper pattern mentioned below) coated with a silane coupling agent on their surfaces and having an average particle size of 1.6 μm, and 1.5 parts by weight of a leveling agent (manufactured by Sannopko, tradename: Pernol S4) are mixed together by agitation, and adjusted in viscosity to the range from 45,000 to 49,000 cps at 23±1° C. to obtain group 1 composition.

<Group 2>

Imidazole curing agent (manufactured by Shikoku Kasei Co., Ltd., 2E4MZ-CN) of 6.5 parts by weight.

The compositions of groups 1 and 2 are preserved in a separated manner to each other at the temperature of 25° C. for a month.

D. Material compositions for the preparation of the liquid solder resist.

<Group 1>

100 parts by weight of a photosensitized oligomer (4,000 in molecular weight) obtained by acrylating 50% of epoxy groups of a cresol novolac type epoxy resin (manufactured by Nippon Kayaku Co., Ltd.), 32 parts by weight of a bisphenol A type epoxy resin (manufactured by Yuka Shell Co., Ltd., trade name: Epikote 1001) as a 80% by weight solution in methyl ethyl ketone, 6.4 parts by weight of a polyvalent acrylic monomer (manufactured by Nippon Kayaku Co., Ltd., R604) as a photosensitive monomer, and 3.2 parts by weight of a polyvalent acrylic monomer (manufactured by Kyoeisha Chemical Co., Ltd., DPE6A), are mixed, and then 0.5 part by weight of a leveling agent (manufactured by Kyoeisha Chemical Co., Ltd., Polyflow No. 75) is added to the mixture and mixed together by agitation to obtain group 1 composition.

<Group 2>

3.4 parts by weight of imidazole curing agent (manufactured by Shikoku Kasei Co., Ltd., 2E4MZ-CN), 2 parts by weight of photoinitiator (IRGACURE I-907 by Ciba Geigy), 0.2 parts by weight of a photosensitizer (DETX-S by Nippon Kayaku Co., Ltd. ), and 1.5 part by weight of NMP are mixed together by agitating to obtain group 2 composition.

The compositions of groups 1 and 2 are preserved in a separated manner to each other at the temperature of 25° C. for a month.

E. Manufacturing of the Printed Circuit Board.

(1) The steps (1) and (2) of the Example 1 are caried out.

(2) The material compositons B for the preparation of the interlaminar insulating resin agent are mixed together by agitation, and adjusted in viscosity to 1.5 Pa·s to obtain an interlaminar insulating resin agent (for lower layer).

The material compositions A for the preparation of adhesive for electroless plating are mixed together by agitating, and adjusted in viscosity to 7 Pa·s to obtain an adhesive solution for the electroless plating (for upper layer).

Figure 6B:
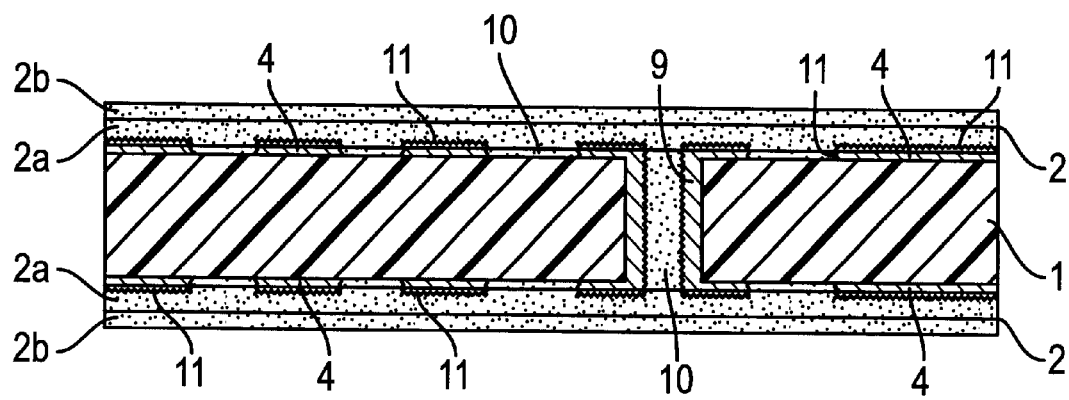

(3) The interlaminar insulating resin agent (for the lower layer) having the viscosity of 1.5 Pa·s prepared at the above step (2) is applied to both surfaces of the substrate within 24 hours after preparing the compostions B, by means of a roll coater and left to stand at horizontal state for 20 minutes and dried (pre-bake) at 60° C. for 30 minutes, and then the adhesive solution (for the upper layer) having the viscosity of 7 Pa·s prepared at the above step (2) is applied to the former layers within 24 hours after preparing the compostions A, and left to stand at horizontal state for 20 minutes and dried (pre-bake) at 60° C. for 30 minutes to form an adhesive layer (two-layer structure) of 35 μm (see FIG. 6(b)).

Figure 7:
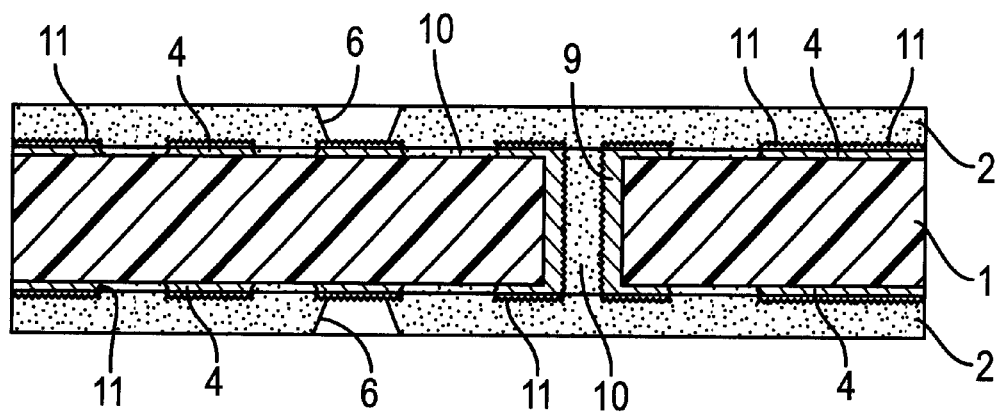

The two-layer structure will be omitted in the drawings as from FIG. 7.

(4) A photomask film depicted with a full circle (black circle) of 85 μm in diameter is attached to both surfaces of the adhesive layers 12 formed on both surfaces of the substrate in the above step (3) and exposed to a light irradiation at 500 mJ/cm² by an ultra-high pressure mercury lamp. The exposed substrate is developed by spraying a DMDG (diethylene glycol dimethyl ether) solution, and further exposed to a light irradiation at 3,000 mJ/cm² by an ultra-high pressure mercury lamp and heated at 100° C. for 1 hour and subsequently at 120° C. for 1 hour and then heated at 150° C. for 3 hours (post-bake) to form an interlaminar insulating material layer (two-layer structure) 2 of 35 μm in thickness provided with openings (openings 6 for the formation of viahole) having excellent dimensional precision corresponding to the photomask film (see FIG. 7). Incidentally, the tin plated layer is partly exposed in the opening for the viahole.

(5) The substrate provided with the openings 6 for the formation of viahole is immersed in chromic acid for 19 minutes to dissolve and remove the epoxy resin particles on the surface of the adhesive layer 2, whereby the surface of the adhesive layer 2 is roughened, and then immersed in a neutralizing solution (manufactured by Shipley) and washed with water.

Further, catalyst nuclei are applied to the surfaces of the adhesive layer 2 and the openings 6 for the formation of viahole by giving a palladium catalyst (manufactured by Atotech Co., Ltd.) to the substrate having the roughened surface (roughened depth: 3 μm) of the adhesive layer.

(6) The substrate is immersed in an electroless copper plating bath having the below composition to form an electroless copper plated film 12 of 0.6 μm in thickness all over the roughened surface (see FIG. 9).

| [Electroless plating solution] | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

(7) A commercially available photosensitive dry film is adhered to the electroless copper plated film 12, and a mask is placed onto the dry film, exposed to a light at 100 mJ/cm² and developed with a 0.8% sodium carbonate solution to form a plating resist 15 having a thickness of 15 μm (see FIG. 10).

(8) The substrate is then subjected to an electrolytic copper plating under the below condition to form an electrolytic copper plated film 13 having a thickness of 15 μm (see FIG. 11).

| [Electrolytic plating solution] | |
| --- | --- |
| sulfuric acid | 180 g/l |
| copper sulfate | 80 g/l |
| additive (made by Atoteck Japan, trade name: Capalacid GL) | 1 ml/l |
| [Electrolytic plating condition] | |
| current density | 1.0 A/dm$^2$ |
| time | 30 minutes |
| temperature | Room temperature |

Figure 12:
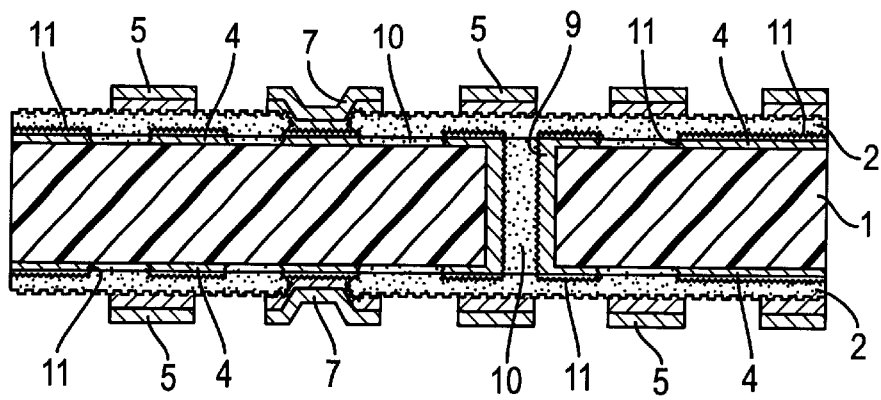

(9) After the plating resist is peeled off by spraying a 5% KOH solution, the electroless plated film 12 located beneath the plating resist 13 is dissolved and removed by etching with a mixed solution of sulfuric acid and hydrogen peroxide to form conductor circuits (inclusive of viaholes) each consisting of the electroless copper plated film 12 and the electrolytic copper plated film 13 and having a thickness of 18 μm (see FIG. 12).

(10) Pd remained in the roughened surface of the adhesive layer 12 was removed by immersing in chromic acid (800 g/l) for 1 to 10 minutes.

The multilayer printed wiring board prepared by the above mentioned manner ensures through-holes each provided with a perfectly circular land, and it can provide a land pitch of about 600 μm and thereby through-holes can be formed in a high density so as to densify through-holes easily. In addition, since the number of through-holes in the substrate can be increased, an electric connection with respect to conductor circuits in the multilayer core substrate can sufficiently be ensured through the through-holes.

(10) The substrate provided with the conductor circuit is immersed in an electroless plating solution of pH=9 containing 8 g/l of copper sulfate, 0.6 g/l of nickel sulfate, 15 g/l of citric acid, 29 g/l of sodium hypophosphite, 31 g/l of boric acid and 0.1 g/l of surfactant to form a roughened layer 11 of copper-nickel-phohsphorus having a thickness of 3 μm on the surface of the conductor circuit (see FIG. 13). In this case, the roughened layer 11 has a composition ratio of Cu: 98 mol %, Ni: 1.5% and P: 0.5 mol % as analyzed by EPMA (fluorescent X-ray analyzing device).

Further, the substrate is subject to Cu—Sn substitution plating under the condition of the plating bath containing 0.1 mol/l of tin borofluoride and 1.0 mol/l of thiourea, the temperature being 50° C. and pH being 1.2 to form a tin substitution plated layer of 0.3 μm on the surface of the roughened layer 11 (see FIG. 13 provided that tin substituted layer is not shown).

(11) Further, conductor circuits are formed by repeating the steps (2)–(10) to form a multilayer printed circuit board. In this case, the tin substitution plated layer is not formed on the surface of the roughened layer (see FIGS. 14–19).

(12) Furthermore, a solder resist layer and a solder bump are formed according to the steps (16)–(20) of Example 1 to produce a printed circuit board having solder bumps (see FIG. 20).

The roughened surfaces of the conductor circuit and interlaminar insulating resin layer formed according to Example 3 are subject to measurement of the count value of irregularity level by means of Atomic force microscope (AFM by Olympus Optical Co., Ltd, tradename: NV3000). In these measurements, the count value is obtained within a scanning range of 50 μm, however, Tables 1 and 2 show fifty times multiplication of the actual count value, i.e. the count value of irregularity level at the surface length of 2.5 mm is shown in Tables 1 and 2.

Figure 2:
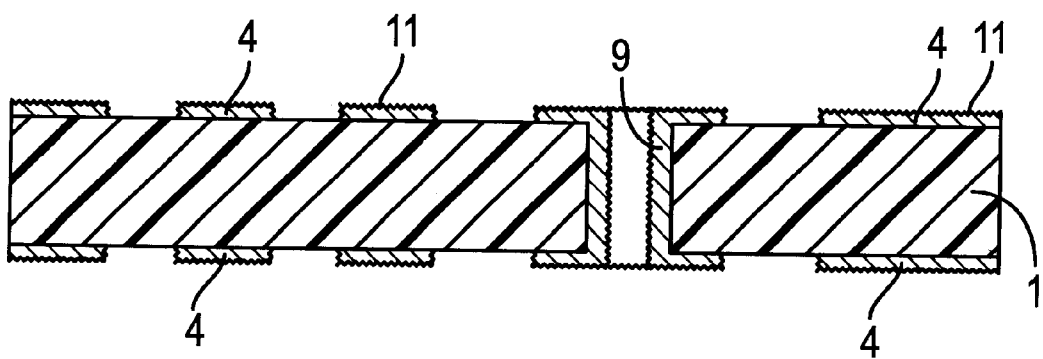

As shown in FIGS. 1 and 2, in the printed circuit board using the adhesive for electroless plating according to the present invention, the count value of irregularity level at the surface length of 2.5 mm with respect to the roughened surface of the adhesive layer is comparatively small, i.e. 50–1300 for the peak count $0.01 \leq Pc \leq 0.1$ μm, and 200–500 for the peak count $0.1 \leq Pc \leq 1.0$ μm, respectively, and residues in the plating resist, electroless plating and Pd catalyst are not found.

Further, the count value with respect to the roughened surface formed on the surface of the conductor circuit is also comparatively small, i.e. 350–650 for the peak count $0.01 \leq Pc \leq 0.1$ μm, and 600–1150 for the peak count $0.1 \leq Pc \leq 1.0$ μm, at the surface length of 2.5 mm, respectively, thereby causing less delay in signal propagation in the conductor circuit.

TABLE 1

| | Conductor circuit | | |
| --- | --- | --- | --- |
| Cut Off | $0 \leq Pc \leq 0.01$ (μm) | $0.01 \leq Pc \leq 0.1$ (μm) | $0.1 \leq Pc \leq 1.0$ (μm) |
| 1 | 0 | 350 | 600 |
| 1/5 | 0 | 500 | 700 |
| 1/20 | 150 | 650 | 1150 |

TABLE 2

| | Interlaminar Insulating resin layer | | |
| --- | --- | --- | --- |
| Cut Off | $0 \leq Pc \leq 0.01$ (μm) | $0.01 \leq Pc \leq 0.1$ (μm) | $0.1 \leq Pc \leq 1.0$ (μm) |
| 1 | 0 | 150 | 350 |
| 1/5 | 0 | 50 | 500 |
| 1/20 | 450 | 1300 | 200 |

COMPARATIVE EXAMPLE 9

The printed circuit board having solder bumps is produced in the same manner as in Example 1 except that the thickness of the interlaminar insulating resin layer is formed to be 35 µm, however, breakage of the interlaminar insulation was found in the roughening treatment.

The tests and evaluations as mentioned below are carried out with respect to the printed circuit boards of the examples and comparative examples.

①. The peel strength is measured according to JIS-C-6481 in the circuit boards of Examples 1–3 and Comparative Examples 1–8.

②. In the circuit boards of Examples 1–3 and Comparative Examples 1–8, the depth of depression of the roughened surface is measured by cross-cutting the circuit board and observing the cut section by means of a metal microscope.

③. The surface resistivity is measured with respect to the circuit boards of Examples 1 and 2 and Comparative Examples 1–3 and 7.

④. In the circuit boards of Example 3 and Comparative Examples 4–6 and 8, the surface resistivity is measured after the circuit board is left to stand under conditions of humidity of 85%, temperature of 130° C. and voltage of 3.3 V for 48 hours.

⑤. The presence or absence of cracks is measured by heat cycle test of −55° C.~125° C. at 500 times with respect to the circuit boards of Examples 1–3 and Comparative Examples 1–8.

⑥. The L/S forming limit is measured with respect to the circuit boards of Examples 1–3 and Comparative Examples 1–8.

⑦. The heating test is carried out with respect to the circuit boards of Examples 1–3 and Comparative Examples 1–8.

The test is carried out under the conditions of 128° C. and 48 hours. According to this heating test, if the resin remains in the opening portion for the formation of viahole, the peeling of viahole is caused. The presence or absence of such a peeling is measured by the conduction resistance of the viahole, whereby the peeling of viahole is confirmed to be caused when the conduction resistance is raised.

⑧. In the circuit boards of Examples 1–3 and Comparative Examples 1–8, the ratio of generating interlaminar insulation breakage is measured by preparing 100 circuit boards.

The test results are shown in Table 3.

TABLE 3

| | | Particle size of heat-resistant resin particle (µm) | Peel strength (kg/cm) | Depression depth of roughened surface (µm) | Surface resistivity (Ω) | Surface resistivity after being left to stand under high-temperature and high-humidity conditions (Ω) | Cracks | L/S limit (µm) | Peeling of viahole | Ratio of insulation breakage generated (%) |
|---|---|---|---|---|---|---|---|---|---|---|
| Example | 1 | 0.51 | 1.0 | 3 | $2 \times 10^{14}$ | not measured | absence | 20/20 | absence | 0 |
| | 2 | 0.92 | 1.0 | 3 | $1 \times 10^{14}$ | not measured | absence | 20/20 | absence | 0 |
| | 3 | 0.51 | 1.0 | 3 | not measured | $3 \times 10^{12}$ | (2) | 20/20 | absence | 0 |
| Comparative Example | 1 | mixture 3.9/0.5 | 1.9 | 10 | $4 \times 10^{8}$ | not measured | absence | 40/40 | absence | 10 |
| | 2 | ground particle 1.6 | 1.4 | 4 | $8 \times 10^{13}$ | not measured | presence (1) | 20/20 | presence | 0 |
| | 3 | spherical particle 1.6 | 1.0 | 4 | $1 \times 10^{14}$ | not measured | absence | 20/20 | presence | 0 |
| | 4 | mixture 3.9/0.5 | 2.0 | 10 | not measured | $5 \times 10^{10}$ | presence (2) | 40/40 | absence | 10 |
| | 5 | ground particle 1.6 | 1.4 | 4 | not measured | $7 \times 10^{11}$ | presence (1) (2) | 20/20 | presence | 0 |
| | 6 | spherical particle 1.6 | 1.0 | 4 | not measured | $2 \times 10^{8}$ | presence (2) | 20/20 | presence | 0 |
| | 7 | mixture 5.5/0.5 | 2.6 | 11 | $2 \times 10^{8}$ | not measured | absence | 45/45 | absence | 15 |
| | 8 | mixture 5.5/0.5 | 2.7 | 11 | not measured | $2 \times 10^{10}$ | presence (2) | 45/45 | absence | 15 |

(1) crack starting from anchor of conductor circuit
(2) crack starting from boundary between plating resist and conductor circuit ①As seen from the results of the above table, when using the adhesive for electroless plating according to the invention, the depth of depression in the roughened surface is shallower (3 µm) as compared with the conventional one and hence the practical peel strength of 1.0 kg/cm can be attained. In the printed circuit board according to the invention, therefore, it is possible to make L/S of the pattern smaller.

② The heat-resistant resin particles used in the adhesive for electroless plating and the printed circuit board according to the present invention are not more than 1.5 µm in the average particle size and less than 2 µm in the maximum particle size as seen from the particle size distribution, so that gaps between the layers are not caused by the roughening treatment and there is no interlaminar insulation breakage through conduction between the upper layer and the lower layer.

③ When the opening for the formation of viahole is formed in the interlaminar insulating resin layer of the substrate having the roughened surface of the conductor circuit at the underlayer side, the resin remains in the roughened surface. In this connection, when Examples 1, 2 are compared with Comparative Examples 2 and 3, since fine particles of not more than 1 μm are existent, it is possible to remove the resin residue in the roughening treatment, so that it is guessed that the peeling of viahole is not caused even in the heating test.

④ The surface resistivity in the circuit board of Examples 1, 2 is higher than those of Comparative Examples 1, 7. It is considered that in the circuit board of Comparative Example 1, the electroless plated film is retained because the depression of the roughened surface is too deep.

⑤ In the circuit board of Example 3, the surface resistivity does not lower even under high temperature and high humidity conditions. On the contrary, when the circuit boards of Comparative Examples 4, 8 are exposed to high temperature and high humidity conditions, the surface resistivity lowers. This is presumed that in the circuit boards of Comparative Examples 4, 8, the depression of the roughened surface is deeper than that in Example 3, so that a greater amount of Pd catalyst nucleus is attached and results in the lowering of the surface resistivity.

⑤ In the circuit boards of Examples 1, 2 and Comparative Examples 1, 7, there is caused no cracks in the heat cycle. On the contrary, the circuit boards of Example 3 and Comparative Examples 4, 5, 6, 8 cause the crack in the interlaminar insulating resin layer (adhesive layer for electroless plating) starting from the boundary between the plating resist and the conductor circuit.

⑥ In the circuit boards of Comparative Examples 2, 5, cracks starting from the anchor depression beneath the conductor circuit is caused in the adhesive layer for electroless plating. This is considered due to the fact that since the ground powder is sharp in the corner, the resulting anchor depression is also sharp and stress concentration is caused therein in the heat cycle to cause cracks. That is, when the ground powder is used, the peel strength is improved, but the cracks are caused in the heat cycle.

⑦ In the adhesive for electroless plating of Example 1, gelation occurred after a month from mixing the compositions, and the adhesive has become too high in viscosity to be coated on the substrate, while in the adhesive for electroless plating of Example 3, lowering of the coating property was not found.

Moreover, the example of JP-A-61-276875 uses epoxy modified polyimide resin as a resin matrix, so that the toughness value is higher than that of epoxy-PES resin and the peel strength of 1.6 kg/cm is obtained.

INDUSTRIAL APPLICABILITY

As mentioned above, in the adhesive for electroless plating according to the present invention, the practical peel strength can be ensured, and the surface resistivity is high and also the fine pattern of L/S=20/20 μm can be formed, so that there can be provided the printed circuit board having no interlaminar insulation breakage through the roughening treatment.

Further, in the adhesive for electroless plating according to the present invention, the adhesive resin remaining in the bottom of the opening for viahole can be removed in the roughening treatment, so that the printed circuit board using such an adhesive does not cause the peeling of viahole in the heating test.

What is claimed is:

1. An adhesive for electroless plating formed by dispersing cured heat-resistant resin particles soluble in acid or oxidizing agent into uncured heat-resistant resin matrix hardly soluble in acid or oxidizing agent through curing treatment, characterized in that the heat-resistant resin particles have an average particle size of not more than 1.5 μm.

2. The adhesive for electroless plating according to claim 1, wherein the heat-resistant resin particles have an average particle size of 0.1–1.0 μm.

3. An adhesive for electroless plating according to claim 1, wherein the heat-resistant resin particles are spherical particles.

4. The adhesive for electroless plating according to claim 1, wherein the heat-resistant resin particles have a particle size distribution such that the particles do not have a particle size in a peak of the distribution which is more than 1.5 μm.

5. The adhesive for electroless plating according to claim 1, wherein a particle size distribution of the heat resistant particles has one peak in the particle size distribution.

6. The adhesive for electroless plating according to claim 1, wherein the heat-resistant resin particles is 5–50% by weight to a solid of the heat-resistant resin matrix.

7. The adhesive for electroless plating according to claim 1, wherein the heat-resistant resin matrix is a composite of the thermoseting resin and thermoplastic resin.

8. The adhesive for electroless plating according to claim 7, wherein the thermoplatic resin is not more than 30% by weight of a solid content of the heat-resistant resin matrix.

9. A printed circuit board comprising a substrate, a cured adhesive layer for electroless plating having a roughened surface, and a conductor circuit formed on the roughened surface of the adhesive layer, said adhesive layer being composed of an adhesive for electroless plating formed by dispersing cured heat-resistant resin particles soluble in acid or oxidizing agent into uncured heat-resistant resin matrix hardly soluble in acid or oxidizing agent through curing treatment, said heat-resistant resin particles having an average particle size of not more than 1.5 μm.

10. The printed circuit board according to claim 9, wherein the heat-resistant resin particles have an average particle size of 0.1–1.0 μm.

11. The printed circuit board according to claim 9, wherein the heat-resistant resin particles are spherical particles.

12. The printed circuit board according to claim 9, wherein the heat-resistant resin particles have a particle size distribution such that the particles do not have a particle size in a peak of the distribution which is more than 1.5 μm.

13. The printed circuit board according to claim 9, wherein a particle size distribution of the heat-resistant particles has one peak in the particle size distribution.

14. The printed circuit board according to claim 9, wherein the roughened surface of the adhesive layer has a depression depth $R_{max}$=1–5 μm.

15. The printed circuit board according to claim 9, wherein the depth of said roughened surface is 1–5 μm, a count value of the peak (Pc) of the roughness per a 2.5 mm length of the surface, where $0.01 \leq Pc < 0.1$ μm, is 10–2500, and a count value of the peak (Pc) of the roughness per a 2.5 mm length of the surface, where $0.1 \leq Pc < 1.0$ μm, is 100–1000.

16. The printed circuit board according to claim 9, wherein the heat-resistant resin particles is 5–50% by weight of a solid of the heat-resistant resin matrix.

17. A printed circuit board comprising a substrate, a conductor circuit formed on the substrate, an adhesive layer for electroless plating formed by dispersing cured heat-resistant resin particles soluble in acid or oxidizing agent into uncured heat-resistant resin matrix hardly soluble in acid or oxidizing agent through curing treatment, a roughened surface formed on a surface of the adhesive layer by dissolving and removing the cured heat-resistant particles, and an upper conductor circuit is formed on the roughened surface, said adhesive layer for electroless plating has more heat-resistant particles at the side of the substrate than that at the opposite side thereof.

18. The printed circuit board according to claim 17, wherein the adhesive layer is formed in double-layer, and the heat-resistant particles in the adhesive layer at the side of the substrate is 20–50% by weight of a solid content of the heat-resistant resin matrix, and the heat-resistant particles in the adhesive layer at the opposite side of the substrate is not less than 5% by weight but less than 20% by weight of a solid content of the heat-resistant resin matrix.

19. The printed circuit board according to claim 17, wherein the heat-resistant resin particles have an average particle size of 0.1–1.0 $\mu$m.

20. The printed circuit board according to claim 9, wherein the heat-resistant resin matrix is a composite of the thermoseting resin and thermoplastic resin.

21. The printed circuit board according to claim 9, wherein the thermoplatic resin is not more than 30% by weight of a solid content of the heat-resistant resin matrix.

22. The printed circuit board according to claim 20, wherein the heat-resistant resin matrix is a composite of epoxy resin and a polyether sulphone, and the polyether sulphone in the composite is not more than 30% by weight of a solid content of the heat-resistant resin matrix.

23. The printed circuit board according to claim 9, wherein viaholes having diameter of less than 100 $\mu$m are formed in the adhesive layer.

24. The printed circuit board according to claim 9, wherein the adhesive layer has a thickness of less than 50 $\mu$m.

25. The printed circuit board according to claim 9, wherein the conductor circuit formed on the roughened surface of the adhesive layer is comprised of an electroless plated film and an electrolytic plated film.

26. The printed circuit board according to claim 9, wherein the conductor circuit formed on the roughened surface of the adhesive layer has a roughened layer formed on at least a part of the conductor circuit.

27. The printed circuit board according to claim 9, wherein a conductor circuit is formed on a surface of the substrate, said conductor circuit having at least a part thereof a roughend surface.

28. A material composition for preparing an adhesive for electroless plating, comprising:

a resin composition of a first group comprising uncured thermosetting resin which becomes hardly soluble in an acid or oxidizing agent through curing treatment;

a resin composition of a second group comprising cured heat-resistant resin particles soluble an acid or oxidizing agent and having an average particle size of not more than 1.5 $\mu$m, thermoplastic resin, and organic solvent; and a curing agent composition of a third group, wherein each group is prepared in advance for mixture, and preserved separately from one another.

29. The material composition according to claim 28, wherein the a mixing ratio of the heat-resistant resin particles is 5–50% by weight of a solid of the heat-resistant resin matrix in the prepared adhesive agent, as a weight ratio.

30. The material composition, according to claim 28, wherein a weight ratio between the thermosetting resin of the first group and the thermoplastic resin of the second group is 1/4~4/1.

* * * * *

UNITED STATES PATENT AND TRADEMARK OFFICE
CERTIFICATE OF CORRECTION

PATENT NO. : 6,261,671 B1
DATED : July 17, 2001
INVENTOR(S) : Motoo Asai et al.

It is certified that error appears in the above-identified patent and that said Letters Patent is hereby corrected as shown below:

<u>Title page,</u>
Item [56], References Cited, insert U.S. PATENT DOCUMENTS as follows:

-- 5,519,177    5/1996    Wang et al.
5,921,472    7/1999    Haruch --

Item [56], References Cited, insert FOREIGN PATENT DOCUMENTS as follows:

-- 455555    9/1992    Japan
63158156    7/1988    Japan
2188992    7/1990    Japan
61276875    12/1986    Japan
734048    2/1995    Japan
104262    1/1998    Japan
63126297    5/1988    Japan
53388    1/1993    Japan
6283860    10/1994    Japan
9847328    10/1998    W.I.P.O.
28283    1/1990    Japan
104261    1/1998    Japan --

<u>Column 24,</u>
Line 54, "U.S. Pat. No. 5,921,472" should be -- U.S. Pat. No. 5,021,472 --.

Signed and Sealed this

Tenth Day of September, 2002

*Attest:*

JAMES E. ROGAN
*Attesting Officer*    *Director of the United States Patent and Trademark Office*